US011157102B2

(12) United States Patent
Lee et al.

(10) Patent No.: US 11,157,102 B2
(45) Date of Patent: Oct. 26, 2021

(54) TOUCH DISPLAY DEVICE AND PANEL

(71) Applicant: LG DISPLAY CO., LTD., Seoul (KR)

(72) Inventors: JaeGyun Lee, Paju-si (KR); Yangsik Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 4 days.

(21) Appl. No.: 16/037,727

(22) Filed: Jul. 17, 2018

(65) Prior Publication Data

US 2019/0121474 A1    Apr. 25, 2019

(30) Foreign Application Priority Data

Oct. 23, 2017  (KR) .................. 10-2017-0137600

(51) Int. Cl.

| G06F 3/041 | (2006.01) |
|---|---|
| G06F 3/044 | (2006.01) |
| G06F 3/047 | (2006.01) |
| G09G 3/3266 | (2016.01) |
| G09G 3/3291 | (2016.01) |
| H01L 27/32 | (2006.01) |
| H01L 51/52 | (2006.01) |

(52) U.S. Cl.
CPC ............ *G06F 3/0412* (2013.01); *G06F 3/047* (2013.01); *G06F 3/0443* (2019.05); *G06F 3/0446* (2019.05); *G06F 3/0448* (2019.05); *G09G 3/3266* (2013.01); *G09G 3/3291* (2013.01); *H01L 27/323* (2013.01); *H01L 27/3276* (2013.01); *G06F 2203/04104* (2013.01); *G06F 2203/04112* (2013.01); *H01L 51/5237* (2013.01)

(58) Field of Classification Search
CPC .... G06F 3/0412; G06F 3/3291; G06F 3/0448; G06F 3/047; G06F 3/044; G06F 3/3266; G06F 3/0446; G06F 3/0443; G06F 2203/04112; G06F 2203/04104; H01L 27/3276; H01L 27/323; H01L 51/5237; G09G 3/3266; G09G 3/3291
USPC ........................................... 345/76, 173, 174
See application file for complete search history.

(56) References Cited

U.S. PATENT DOCUMENTS

| 10,620,733 | B2 * | 4/2020 | Koudo ................. G06F 3/0446 |
| 2015/0212537 | A1 * | 7/2015 | Cok ........................ G06F 3/046 345/174 |
| 2015/0220181 | A1 * | 8/2015 | Jung ..................... G06F 3/044 345/174 |
| 2016/0195983 | A1 * | 7/2016 | Miyake ................ G06F 3/0412 345/174 |
| 2017/0083137 | A1 * | 3/2017 | Kurasawa ............ G06F 3/0412 |

(Continued)

FOREIGN PATENT DOCUMENTS

WO    WO-2017154443 A1 *  9/2017  .......... G06F 3/0416

*Primary Examiner* — Jimmy H Nguyen
(74) *Attorney, Agent, or Firm* — Birch, Stewart, Kolasch & Birch, LLP

(57) ABSTRACT

A touch display device can include a panel including a plurality of touch electrodes including a first touch electrode and a second touch electrode, the first touch electrode being adjacent to and electrically isolated from the second touch electrode; a touch sensing circuit configured to drive the panel to sense a touch or a touch position; and at least one external dummy metal disposed in a boundary region between the first touch electrode and the second touch electrode, in which the at least one external dummy metal is spaced apart from and electrically isolated from the first and second touch electrodes.

20 Claims, 20 Drawing Sheets

(56) References Cited

U.S. PATENT DOCUMENTS

| | | | |
|---|---|---|---|
| 2017/0228052 A1* | 8/2017 | Nakamura | G06F 3/03545 |
| 2018/0032189 A1* | 2/2018 | Lee | G06F 3/0443 |
| 2018/0033832 A1* | 2/2018 | Park | G06F 1/1652 |
| 2018/0040672 A1* | 2/2018 | Park | G06F 3/0446 |

* cited by examiner

TOUCH DISPLAY DEVICE AND PANEL

CROSS REFERENCE TO RELATED APPLICATION

This application claims priority from Korean Patent Application No. 10-2017-0137600, filed in the Republic of Korea on Oct. 23, 2017, the entirety of which is hereby incorporated by reference for all purposes as if fully set forth herein.

BACKGROUND OF THE INVENTION

1. Field of the Invention

The present disclosure relates to a touch display device and a panel.

2. Description of the Background Art

As society develops further into an information society, demand for display devices having various forms for displaying images is increasing. In recent years, various display devices, such as a liquid crystal display device, a plasma display device, and an Organic Light-Emitting Diode (OLED) display device have been utilized.

Such display devices include a touch display device capable of providing a touch-based input system that enables a user to easily input information or a command intuitively and conveniently, while avoiding conventional input systems, such as a button, a keyboard, and a mouse.

In order to provide such a touch-based input system, it is necessary to determine the presence or absence of a user's touch, and to correctly detect touch coordinates.

For this purpose, among various types of touch sensing schemes, a capacitance-based touch sensing scheme for detecting the presence or absence of a touch, touch coordinates, or the like based on a change in capacitance formed on a plurality of touch electrodes disposed on a touch panel, has been widely used.

A touch panel of a conventional touch display device has a plurality of touch electrodes, which is densely arranged in a complicated form thereon. Thus, an electrical short circuit may occur between the touch electrodes due to foreign matter or the like that may be introduced during a manufacturing process. Such an electrical short circuit between the touch electrodes may make touch sensing itself impossible or significantly reduce touch sensitivity.

SUMMARY OF THE INVENTION

In view of the foregoing, an aspect of embodiments of the present disclosure is to provide a touch display device and a panel having a structure capable of preventing a short circuit between touch electrodes.

Another aspect of embodiments of the present disclosure is to provide a touch display device and a panel having a structure capable of improving touch sensitivity.

Still another aspect of embodiments of the present disclosure is to provide a touch display device and a panel having a structure capable of improving image quality while improving touch sensitivity.

In an aspect, embodiments disclosed herein can provide a touch display device including a panel on which a plurality of touch electrodes is arranged, and a touch sensing circuit configured to sense the presence or absence of a touch, or a position of a touch by driving the panel.

In such a touch display device, among the plurality of touch electrodes, a first touch electrode and a second touch electrode adjacent to each other can be electrically separated from each other.

In a boundary region between the first touch electrode and the second touch electrode, at least one external dummy metal, spaced apart from the first touch electrode and the second touch electrode, can be disposed.

The at least one external dummy metal can be disposed on the same layer as the plurality of touch electrodes and can be made of the same material as the plurality of touch electrodes.

In the boundary region between the first touch electrode and the second touch electrode, a plurality of external dummy metals can be arranged in a row or in two or more rows.

In the boundary region between the first touch electrode and the second touch electrode, the outline of at least one of the first touch electrode and the second touch electrode can be in the form of a line.

The outline of an electrode metal corresponding to at least one of the first touch electrode and the second touch electrode can have a plurality of protrusions in the boundary region between the first touch electrode and the second touch electrode.

Each of the plurality of touch electrodes can be an electrode metal patterned in a mesh type, and one or more internal dummy metals broken with the electrode metal patterned in the mesh type can be disposed in a region of all or some of the plurality of touch electrodes.

The one or more internal dummy metals can be disposed on the same layer as an electrode metal corresponding to each of the plurality of touch electrodes and can be made of the same material as the electrode metal.

The panel is a display panel, on which a plurality of data lines, a plurality of gate lines, and a plurality of sub-pixels are arranged, and can be of a type incorporating a touch panel therein.

A plurality of open areas can exist in a region of each of the plurality of touch electrodes disposed on the panel, and each of the plurality of open areas can correspond to a light-emitting region of at least one sub-pixel.

The plurality of touch electrodes can be placed on an encapsulation layer in the panel.

In another aspect, embodiments of the present disclosure can provide a panel in which a plurality of touch electrodes and a plurality of touch lines electrically connected to the plurality of touch electrodes are disposed.

In this panel, among the plurality of touch electrodes, adjacent first and second touch electrodes may be electrically separated from each other.

In the panel, at least one external dummy metal can be disposed within a boundary region between the first touch electrode and the second touch electrode, spaced apart from the first touch electrode and the second touch electrode.

The at least one external dummy metal can be disposed on the same layer as the plurality of touch electrodes and can be made of the same material as the plurality of touch electrodes.

In the boundary region between the first touch electrode and the second touch electrode, the outline of at least one of the first touch electrode and the second touch electrode can be in the form of a line.

In the boundary region between the first touch electrode and the second touch electrode, at least one of the first touch electrode and the second touch electrode can have a plurality of protrusions.

Each of the plurality of touch electrodes can be an electrode metal patterned in a mesh type, and one or more internal dummy metals broken with the electrode metal patterned in the mesh type can be disposed in a region of all or some of the plurality of touch electrodes.

The one or more internal dummy metals can be disposed on the same layer as an electrode metal corresponding to each of the plurality of touch electrodes and can be made of the same material as the electrode metal.

According to the embodiments of the present disclosure described above, it is possible to provide a touch display device and a panel having a structure capable of preventing a short circuit between touch electrodes.

According to the embodiments of the present disclosure, it is possible to provide a touch display device and a panel having a structure capable of improving touch sensitivity.

According to the embodiments of the present disclosure, it is possible to provide a touch display device and a panel having a structure capable of improving image quality while improving touch sensitivity.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION OF THE EMBODIMENTS

Figure 1:
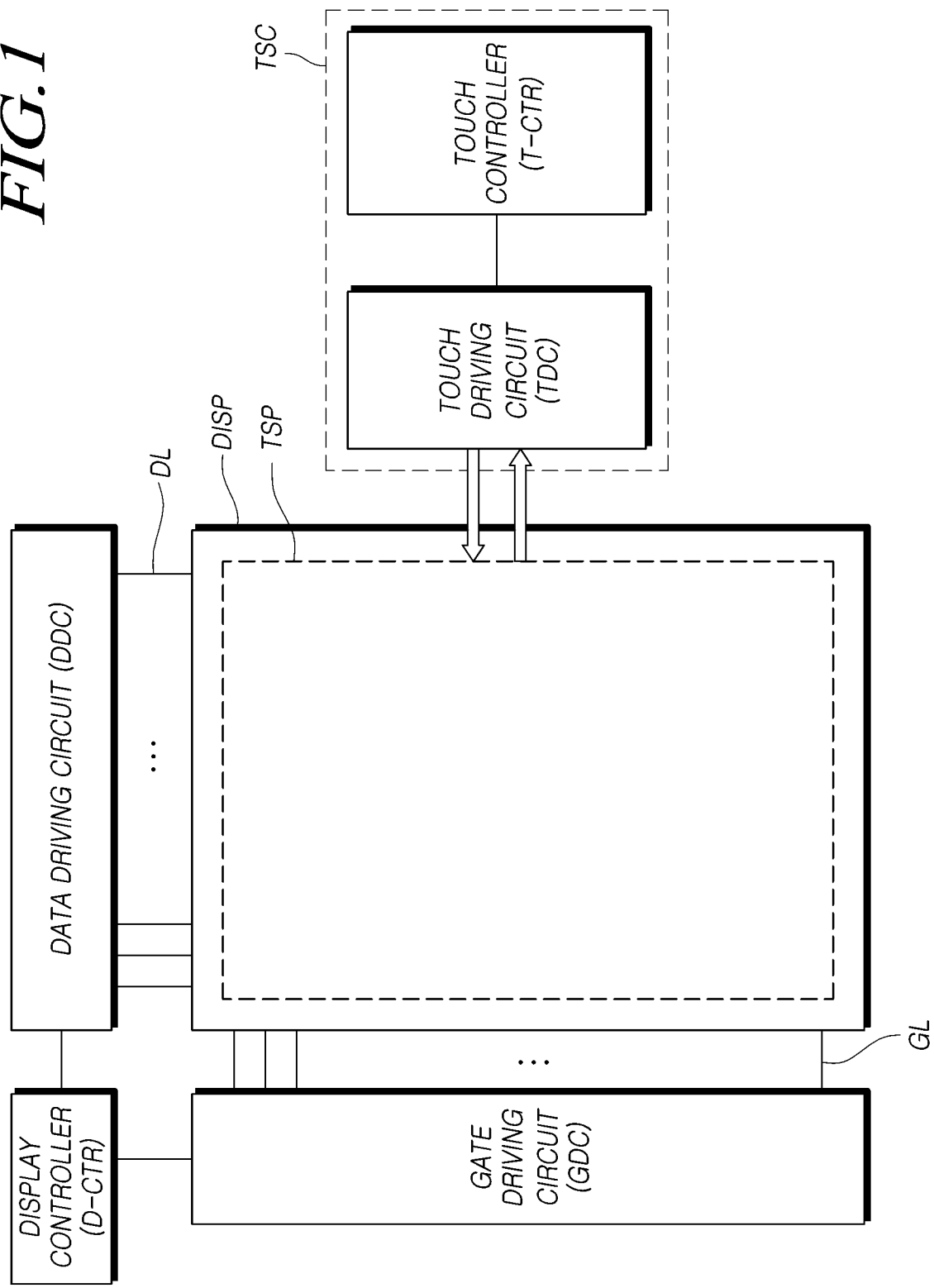
FIG. 1 is a system configuration diagram of a touch display device according to embodiments of the present disclosure.

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the situation that it is described that a certain structural element "is connected to," "is coupled to," or "is in contact with" another structural element, it should be interpreted that another structural element may "be connected to," "be coupled to," or "be in contact with" the structural elements as well as that the certain structural element is directly connected to or is in direct contact with another structural element.

FIG. 1 is a system configuration diagram of a touch display device according to embodiments of the present disclosure.

Referring to FIG. 1, a touch display device according to embodiments of the present disclosure can provide an image display function for displaying images and a touch sensing function for sensing a user's touch.

The touch display device according to embodiments of the present disclosure can include a display panel DISP in which data lines and gate lines are arranged, a display driving circuit configured to drive the display panel DISP, and the like, for image display.

The display driving circuit can include a data driving circuit DDC configured to data lines, a gate driving circuit GDC configured to drive gate lines, a data driving circuit DDC, a display controller D-CTR configured to control the gate driving circuit, and the like.

The touch display device according to embodiments of the present disclosure can include a touch panel TSP in which a plurality of touch electrodes TE is disposed as touch sensors for touch sensing, and a touch sensing circuit TSC configured to perform driving and sensing processing of the touch panel TSP, and the like.

The touch sensing circuit TSC supplies a driving signal to the touch panel TSP in order to drive the touch panel TSP, detects a sensing signal from the touch panel TSP, and senses the presence or absence of a touch and/or a touch position (touch coordinates).

Such a touch sensing circuit TSC can include a touch driving circuit TDC configured to supply a driving signal and to receive a sensing signal, a touch controller T-CTR configured to calculate the presence or absence of a touch and/or a touch position (touch coordinates).

The touch sensing circuit TSC may be implemented with one or more components (e.g., integrated circuits), and may be implemented separately from the display driving circuit.

In addition, the entirety or a part of the touch sensing circuit TSC can be integrated with the display driving circuit and one or more of the internal circuits of the display driving circuit. For example, the touch driving circuit TDC of the touch sensing circuit TSC can be implemented as an integrated circuit together with the data driving circuit DDC of the display driving circuit.

Also, the touch display device according to embodiments of the present disclosure is capable of sensing a touch based on a capacitance formed on the touch electrodes TE.

The touch display device according to embodiments of the present disclosure adopts a capacitance-based touch sensing scheme, in which a touch can be sensed by a mutual-capacitance-based touch sensing scheme or by a self-capacitance-based touch sensing scheme.

Figure 2:
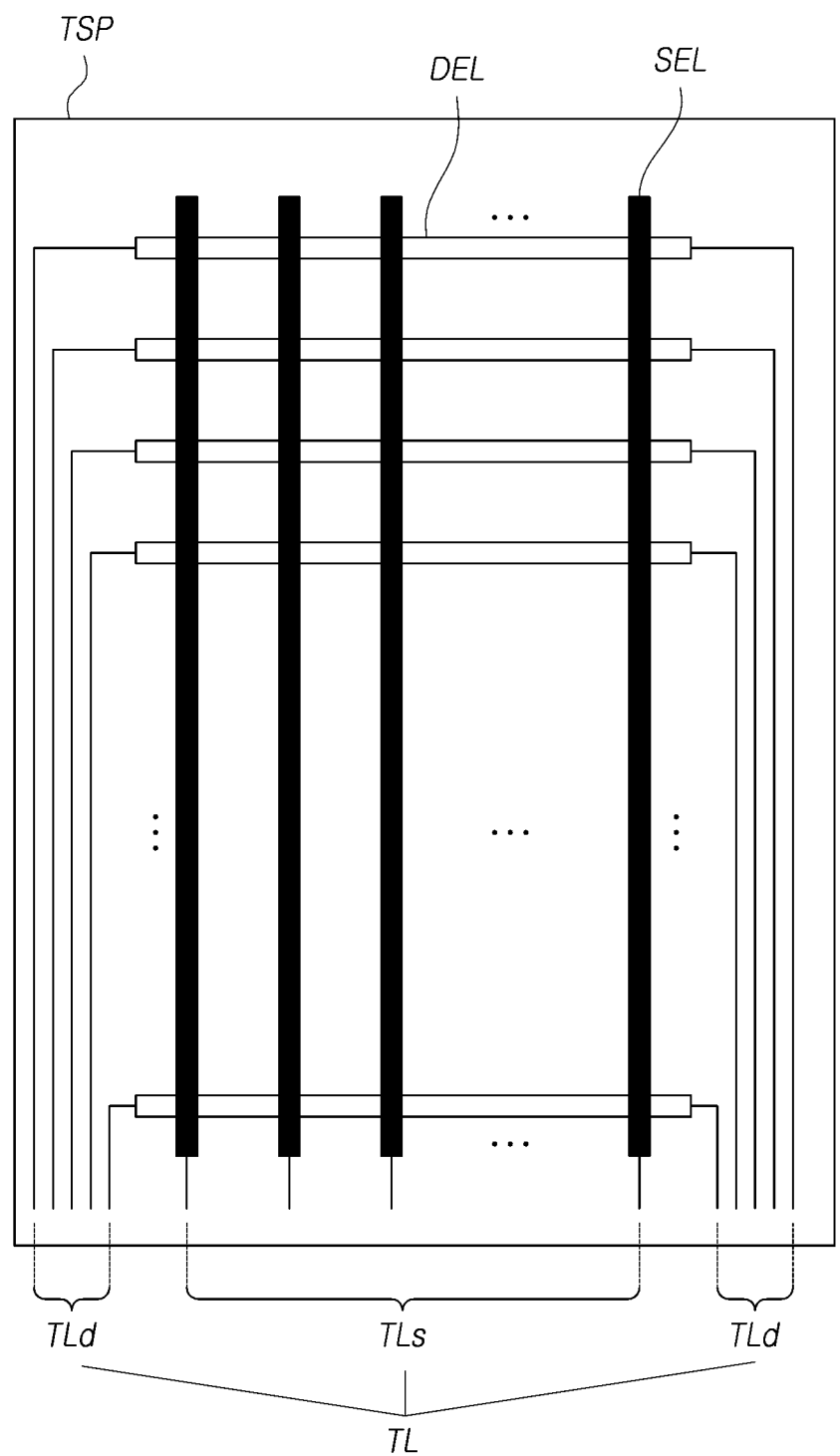
FIG. 2 is an example diagram of a touch panel in the touch display device according to embodiments of the present disclosure.
Figure 3:
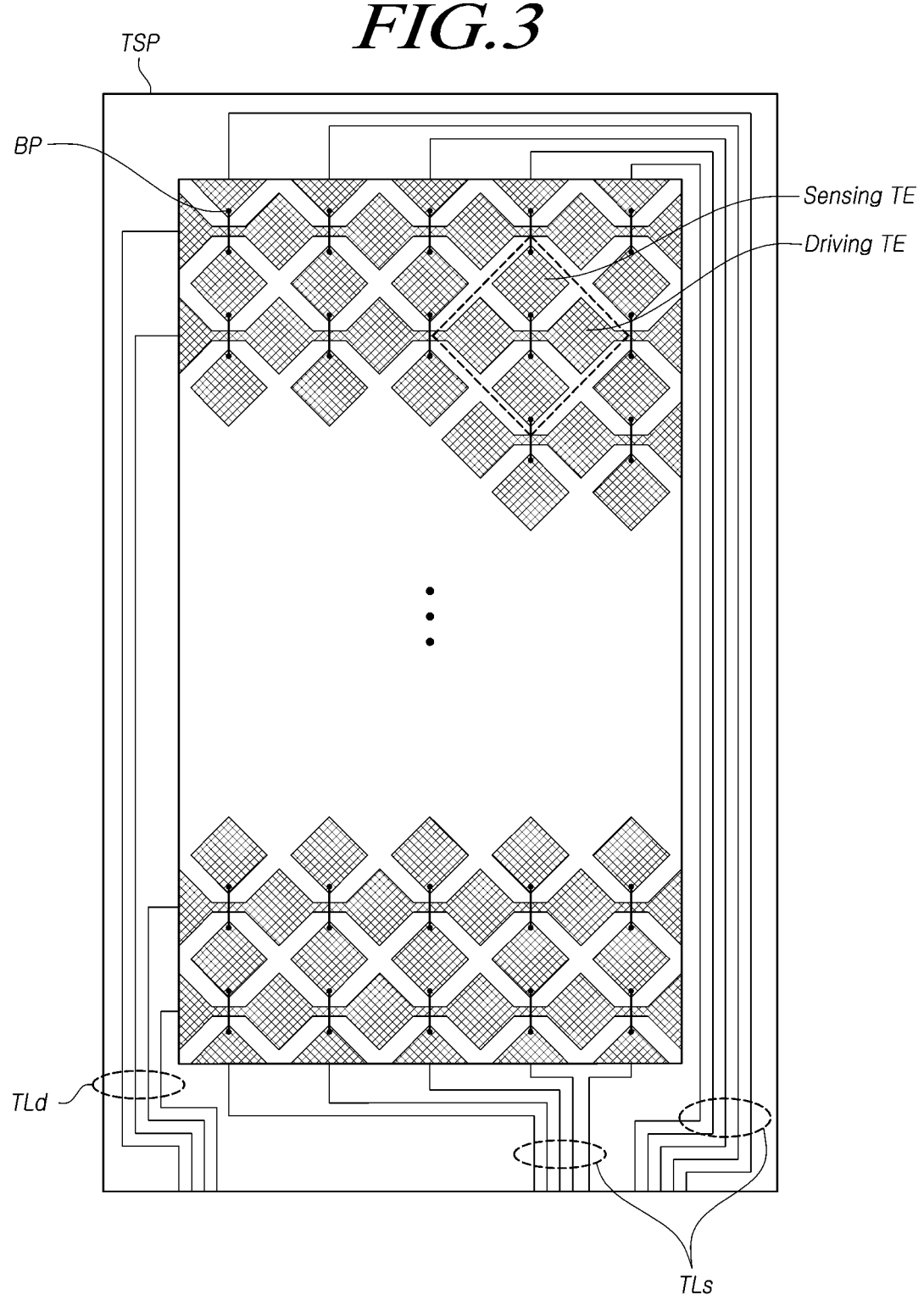
FIG. 3 is another example diagram of a touch panel in the touch display device according to embodiments of the present disclosure.
Figure 4:
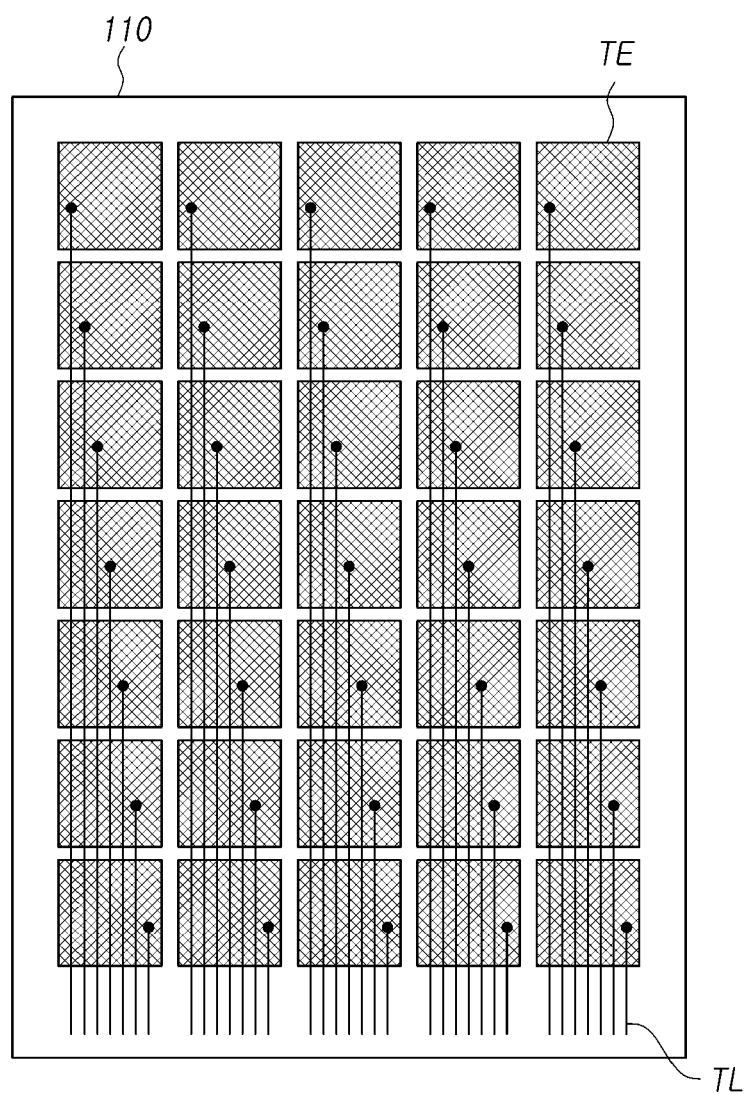
FIG. 4 is still another example diagram of a touch panel in the touch display device according to embodiments of the present disclosure.

FIGS. 2 to 4 are three example diagrams of a touch panel TSP in the touch display device according to embodiments of the present disclosure. FIGS. 2 and 3 are example diagrams of a touch panel TSP when the touch display device senses a touch by a mutual-capacitance-based touch sensing scheme, according to embodiments of the present disclosure. FIG. 4 is an example diagram of a touch panel TSP when the touch display device senses a touch by a self-capacitance-based touch sensing scheme, according to embodiments of the present disclosure.

Referring to FIGS. 2 and 3, in the mutual-capacitance based touch sensing scheme, a plurality of touch electrodes TE arranged in a touch panel TSP may be classified into a driving touch electrode (also referred to as a driving electrode, a transmission electrode, or a drive line) to which a driving signal is applied, and a sensing touch electrode (also referred to as a sensing electrode, a reception electrode, or a sensing line) from which a sensing signal is sensed and which forms a capacitance with the driving electrode.

Referring to FIGS. 2 and 3, the driving touch electrodes that are disposed in the same row (or the same column) are electrically connected to each other by an integration method (or by a connection method using a bridge pattern) to form one driving touch electrode line DEL.

Referring to FIGS. 2 and 3, the sensing touch electrodes disposed in the same column (or the same row) are electrically connected to each other by a bridge pattern BP (or by an integration method) to form one sensing touch electrode line SEL.

In the mutual-capacitance-based touch sensing scheme, the touch sensing circuit TSC applies a driving signal to one or more driving touch electrode lines DEL and receives a sensing signal from one or more sensing touch electrode lines SEL. Based on the received sensing signal, the presence or absence and/or coordinates or the like of a touch are detected based on a change in capacitance (mutual-capacitance) between the driving touch electrode lines DEL and the sensing touch electrode lines SEL depending on the presence or absence of a pointer such as a finger or a pen.

Referring to FIGS. 2 and 3, for driving signal transmission and sensing signal transmission, each of the plurality of driving touch electrode lines DEL and the plurality of sensing touch electrode lines SEL is electrically connected to a touch driving circuit TDC via one or more touch lines TL.

More specifically, for driving signal transmission, each of the plurality of driving touch electrode lines DEL is electrically connected to the touch driving circuit TDC via one or more driving touch lines TLd. For sensing signal transmission, each of the plurality of sensing touch electrode lines SEL is electrically connected to the touch driving circuit TDC via one or more sensing touch lines TLs.

Referring to FIG. 4, in a self-capacitance-based touch sensing scheme, each touch electrode TE disposed in the touch panel TSP functions as a driving touch electrode (driving signal application) and as a sensing touch electrode (sensing signal detection).

That is, a driving signal is applied to each of the touch electrodes TE, and a sensing signal is received via the touch electrode TE to which the driving signal is applied. Therefore, in the self-capacitance-based touch sensing scheme, a driving electrode and a sensing electrode are not separately distinguished from each other (e.g., one electrode performs both functions).

In the self-capacitance-based touch sensing scheme, the touch sensing circuit TSC applies a driving signal to at least one touch electrode TE, receives a sensing signal from the touch electrode TE to which a driving signal is applied, and detects the presence or absence and/or coordinates of a touch and the like based on a change in capacitance between a pointer such as a finger or a pen and the touch electrode TE based on the received sensing signal.

Referring to FIG. 4, for driving signal transmission and sensing signal transmission, each of the plurality of touch electrodes TE is electrically connected to the touch driving circuit TDC via one or more touch lines TL.

Accordingly, the touch display device according to embodiments of the present disclosure can sense a touch by a mutual-capacitance-based touch sensing scheme, or can sense a touch by a self-capacitance-based touch sensing scheme.

Hereinafter, for the convenience of explanation, it is assumed that a mutual-capacitance-based touch sensing scheme is applied to the touch display device and the touch panel TSP according to the embodiments of the present disclosure. However, a self-capacitance-based touch sensing scheme can also be equally applied to the touch display device and the touch panel TSP according to embodiments of the present disclosure.

In addition, in a touch display device according to embodiments of the present disclosure, a touch panel TSP can be of an externally-attached type manufactured separately from a display panel DISP and bonded to the display panel DISP, or can be of a built-in type which is manufactured together with a display panel DISP and is present inside the display panel DISP.

Hereinafter, for the convenience of explanation, it is assumed that the touch panel TSP is a built-in type existing inside the display panel DISP. In this instance, the touch electrodes TE and the touch lines TL are electrodes and signal lines existing inside the display panel DISP.

In addition, the display panel DISP of the touch display device according to embodiments of the present disclosure may be of various types such as an organic light-emitting diode (OLED) panel and a liquid crystal display (LCD) panel. Hereinafter, for the convenience of explanation, an OLED panel will be described as an example.

Figure 5:
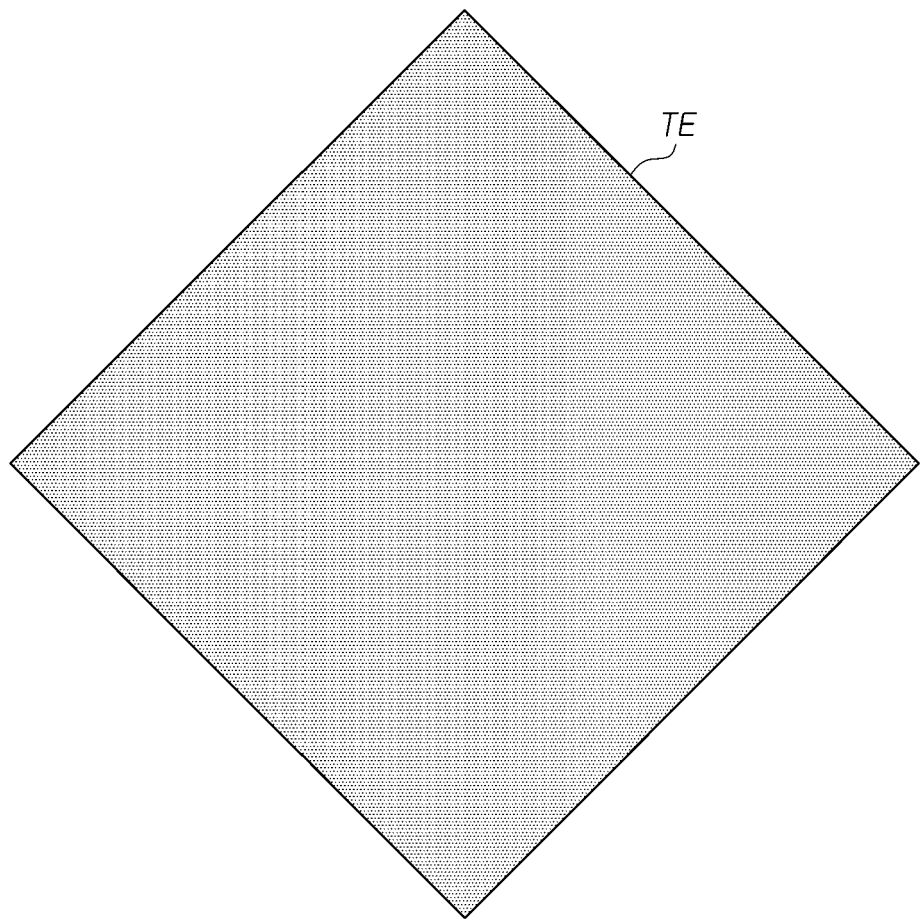
FIG. 5 is a diagram illustrating a non-mesh type touch electrode disposed on a touch panel in the touch display device according to embodiments of the present disclosure.

FIG. 5 is a diagram illustrating a non-mesh type touch electrode TE disposed on a touch panel TSP in the touch display device according to embodiments of the present disclosure.

Referring to FIG. 5, in the touch display device according to embodiments of the present disclosure, each of the plurality of touch electrodes TE disposed on the touch panel TSP can be of a non-mesh type.

The non-mesh type touch electrode TE can be a plate-shaped electrode metal having no open area (e.g., a solid metal plate).

In this instance, the touch electrode TE can be a transparent electrode.

Figure 6:
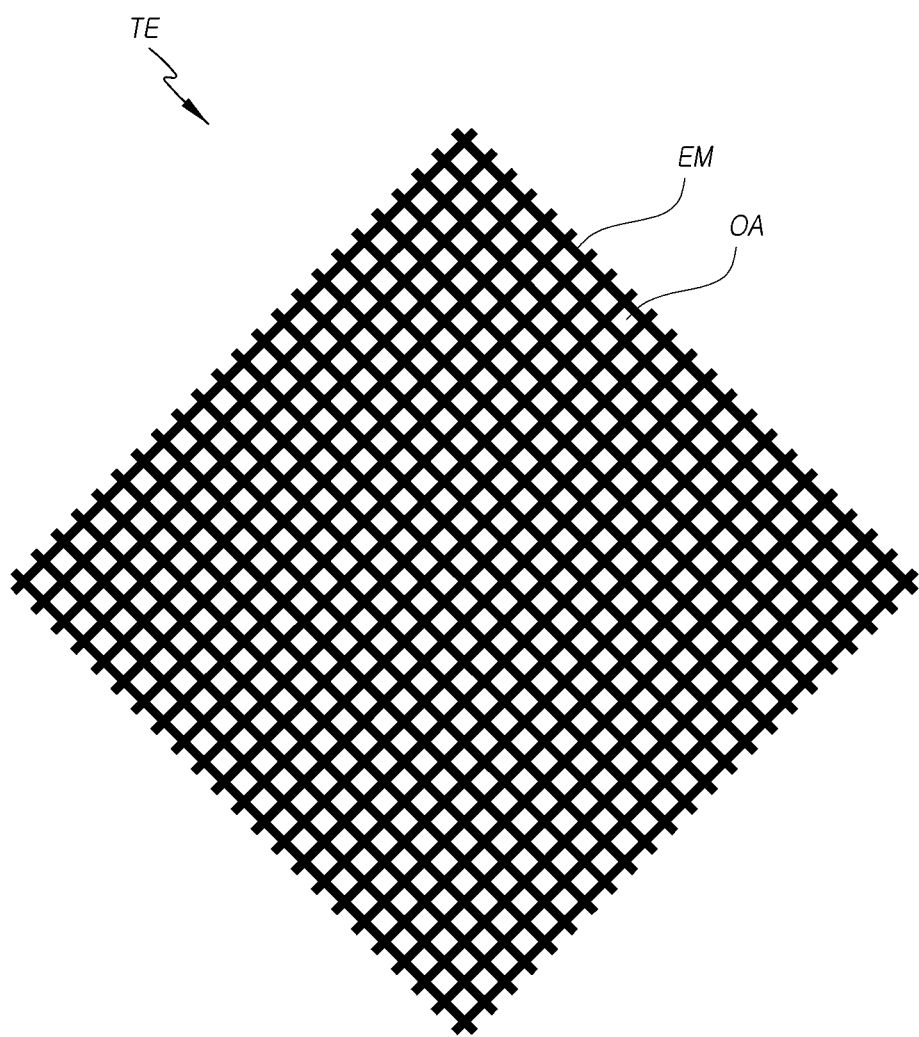
FIG. 6 is a diagram illustrating a mesh type touch electrode disposed on a touch panel in the touch display device according to embodiments of the present disclosure.

FIG. 6 is a diagram illustrating a mesh type touch electrode arranged in a touch panel TSP in the touch display device according to embodiments of the present disclosure.

Referring to FIG. 6, in the touch display device according to embodiments of the present disclosure, each of the plurality of touch electrodes TE disposed on the touch panel TSP can be of a mesh type.

The mesh type touch electrode TE can be made of an electrode metal EM patterned in a mesh type.

Accordingly, a plurality of open areas OA can exist in the region of the mesh-type touch electrode TE (e.g., the touch electrode can have a perforated type of structure or net like structure).

Figure 7:
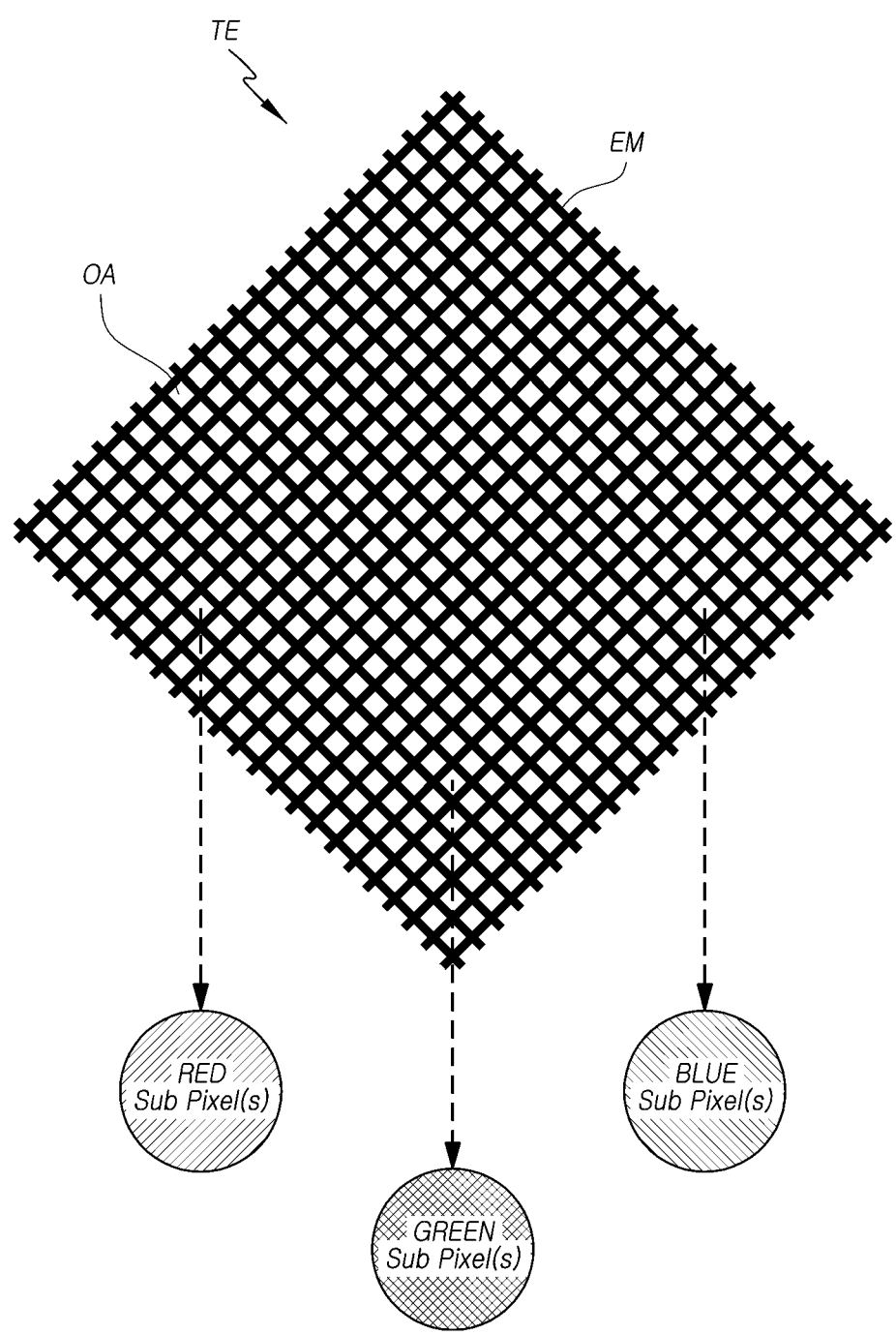
FIG. 7 is a diagram illustrating a correspondence relationship between a mesh-type touch electrode and sub-pixels arranged on a touch panel in the touch display device according to embodiments of the present disclosure.

FIG. 7 is a diagram illustrating a correspondence relationship between a mesh-type touch electrode TE and sub-pixels arranged on a touch panel TSP in the touch display device according to embodiments of the present disclosure.

Referring to FIG. 7, each of a plurality of open areas OA existing in a region of a touch electrode TE made of an electrode metal EM patterned in a mesh type can correspond to a light-emitting region of one or more sub-pixels.

For example, each of the plurality of open areas OA existing in the region of one touch electrode TE can correspond to at least one of red, green, and blue sub-pixels.

In another example, each of the plurality of open areas OA existing in the region of one touch electrode TE can correspond to at least one of red, green, blue, and white sub-pixels.

As described above, since the light-emitting region of one or more sub-pixels is present in each of the open areas OA of each touch electrode TE in a plan view, it is possible to further increase the aperture ratio and light emission efficiency of a display panel DISP while enabling touch sensing.

As described above, the outline or outer perimeter of one touch electrode TE may be approximately rhombic or rectangular (including a square), for example, and an open area OA corresponding to a hole in one touch electrode TE can also be rhombic or rectangular (may include square), for example.

However, the shape of the touch electrode TE and the shape of the open area OA can be variously modified and designed in consideration of the shape of sub-pixels, the arrangement structure of the sub-pixels, touch sensitivity, and the like.

Figure 8:
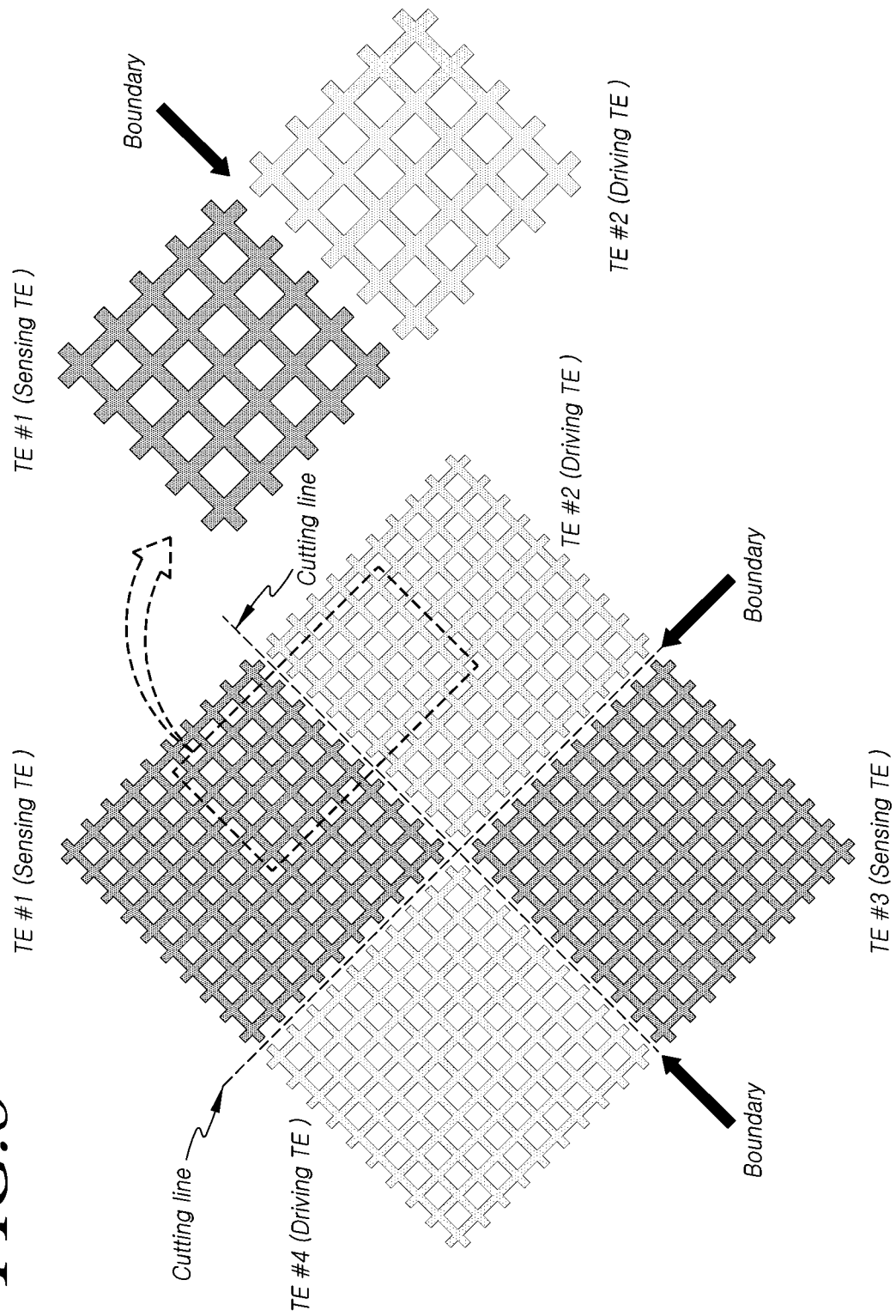
FIG. 8 is a diagram illustrating adjacent touch electrodes disposed on a touch panel in the touch display device according to embodiments of the present disclosure.
Figure 9:
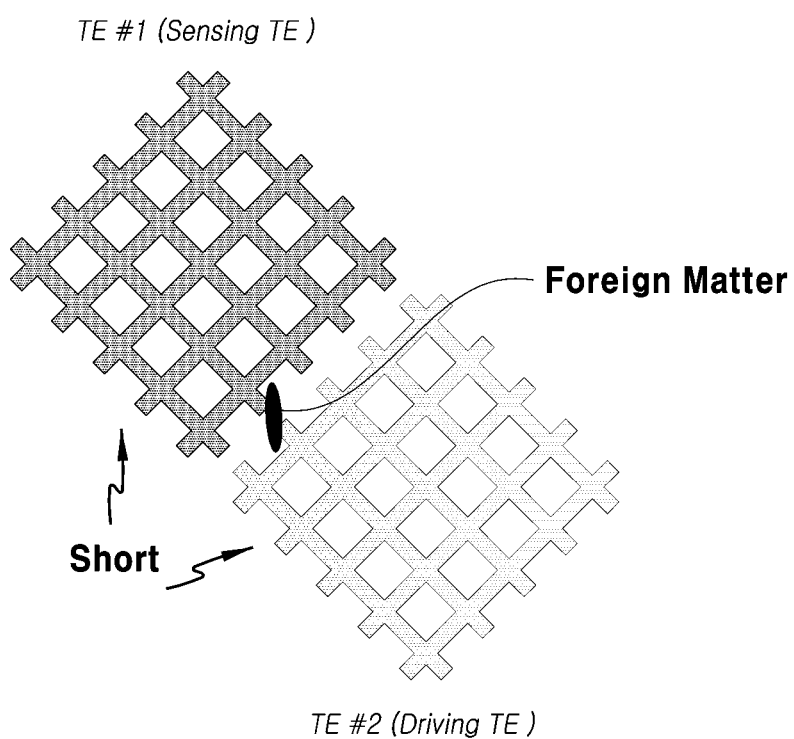
FIG. 9 is a view illustrating a situation where foreign matter is introduced in a boundary region between adjacent touch electrodes disposed on a touch panel and the adjacent touch electrodes are short-circuited in the touch display device according to embodiments of the present disclosure.

FIG. 8 is a diagram illustrating four adjacent touch electrodes TE #1, TE #2, TE #3, and TE #4 disposed on a touch panel TSP in the touch display device according to embodiments of the present disclosure. FIG. 9 is a diagram illustrating a situation in which foreign matter is introduced in a boundary region between adjacent touch electrodes TE #1 and TE #2 disposed on the touch panel TSP, and thus the adjacent touch electrodes TE #1 and TE #2 are short-circuited in the touch display device.

The four touch electrodes TE #1, TE #2, TE #3, and TE #4 illustrated in FIG. 8 are touch electrodes positioned at portions indicated by dotted boxes in FIG. 3.

Each of the four touch electrodes TE #1, TE #2, TE #3, and TE #4 can be an electrode metal EM patterned in a mesh type.

Referring to FIG. 8, the first touch electrode TE #1 and the third touch electrode TE #3 correspond to sensing touch electrodes (Sensing TE) that are electrically connected to each other to form one sensing touch electrode line SEL. The second touch electrode TE #2 and the fourth touch electrode TE #4 correspond to driving touch electrodes (Driving TE) that are electrically connected to each other to form one driving touch electrode line DEL.

Referring to FIG. 8, in the touch display device according to embodiments of the present disclosure, a driving touch electrode (Driving TE) and a sensing touch electrode (Sensing TE) disposed adjacent to the touch panel TSP should be electrically separated from each other.

For example, the first touch electrode TE #1 corresponding to a sensing touch electrode (Sensing TE) and the second touch electrode TE #2 corresponding to the driving touch electrode (Driving TE) are electrically separated from each other in the touch panel TSP.

Regarding a method of forming a touch electrode, the driving touch electrode TE #2 (Driving TE) and the sensing touch electrode TE#1 (Sensing TE) can be formed by patterning an electrode metal EM in a mesh type across the entire region and then cutting an area for a boundary between a driving touch electrode TE #2 (Driving TE) and a sensing touch electrode TE #1 (Sensing TE) along a cutting line (Cutting Line) of FIG. 8. In other words, a common mesh layer can be disposed across a surface and then lines can be cut (e.g., laser cut) to remove portions of the common mesh layer, in order to define touch electrodes.

Therefore, a mesh-type electrode metal EM forming the driving touch electrode TE #2 (Driving TE) and a mesh-type electrode metal EM forming the sensing electrode TE #1 (Sensing TE) are merely cut, but can be a metal that is simultaneously patterned with the same material. Thus, improving manufacturing efficiency.

Referring to FIG. 9, in a boundary region between the first touch electrode TE #1 corresponding to a sensing touch electrode (Sensing TE) and the second touch electrode TE #2 corresponding to a driving touch electrode (Driving TE), the distance between the first touch electrode TE #1 and the second touch electrode TE #2 is set to be very short.

Therefore, if a process failure occurs during fabrication of the panel and foreign matter or the like is introduced in the boundary region between the first touch electrode TE #1 and the second touch electrode TE #2, the first touch electrode TE #1 and the second touch electrode TE #2 may be electrically short-circuited.

When the first touch electrode TE #1 and the second touch electrode TE #2 are short-circuited, the first touch electrode TE #1 cannot serve as a driving touch electrode, and the second touch electrode TE #2 cannot serve as a sensing touch electrode. As a result, the touch sensing may be disabled or the touch sensitivity may be greatly reduced.

When the distance between the first touch electrode TE #1 and the second touch electrode TE #2 is made longer in order to prevent the short circuit between the first touch electrode TE #1 and the second touch electrode TE #2, the ratio between the region where the electrode metal EM is present and the region where the electrode metal EM is not present becomes large. Due to this, a difference in the reflectance of the metal between internal light and external light is generated, and as a result, the touch electrode TE is visible, which may result in deterioration of image quality (e.g., a viewer may be able to recognize the lines that define the electrodes or portions of a displayed image may be distorted due to the non-uniformity caused by the space between electrodes).

Hereinbelow, a structure is proposed for preventing short circuit between the first touch electrode TE #1 and the second touch electrode TE #2 without increasing the distance between the first touch electrode TE #1 and the second touch electrode TE #2 while also avoiding a difference in the reflectance that may result in reduced image quality.

Figure 10:
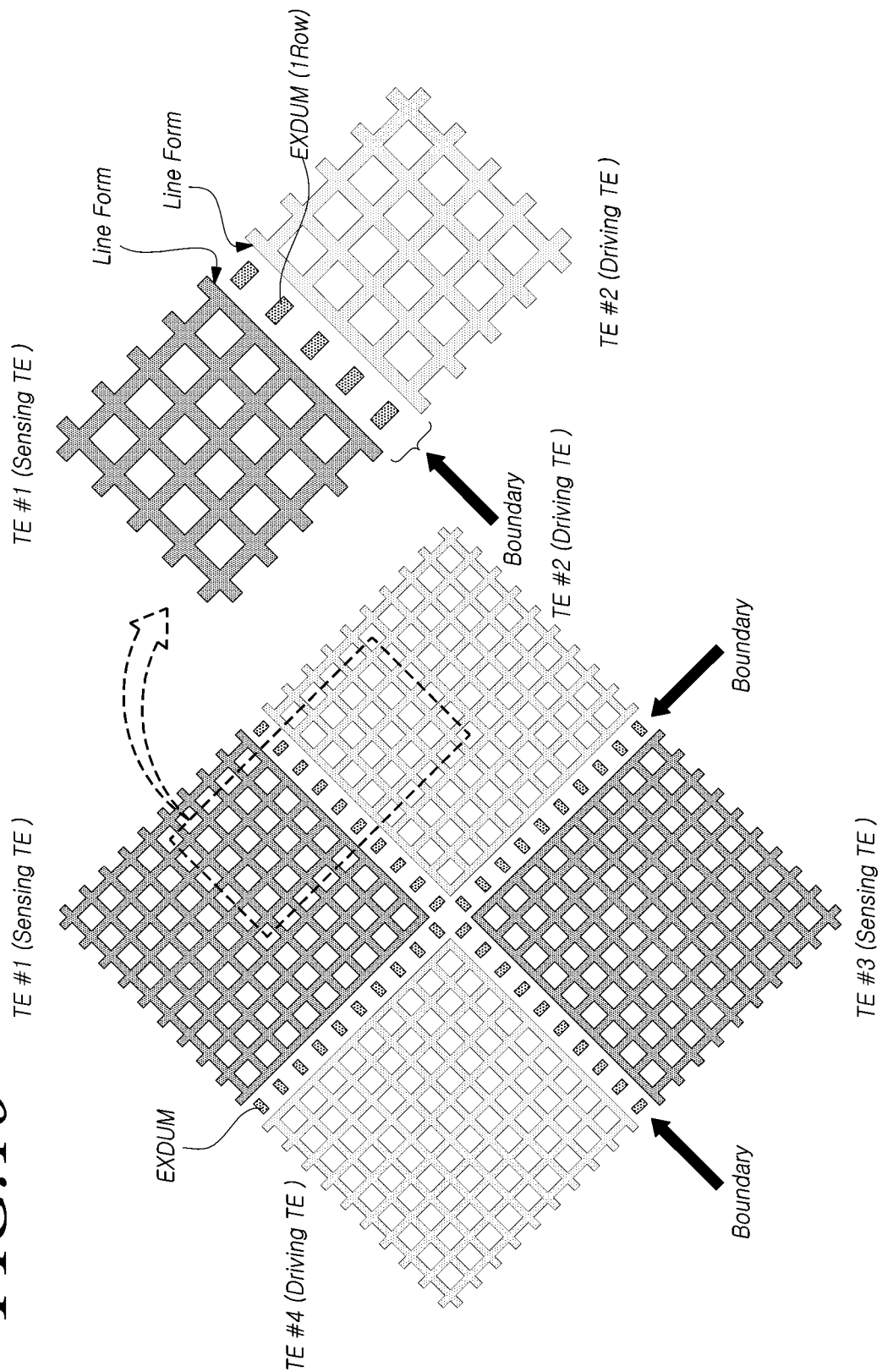
FIGS. 10 to 12 are example diagrams each illustrating a short-circuit prevention structure of adjacent touch electrodes disposed on a touch panel in the touch display device according to embodiments of the present disclosure.
Figure 11:
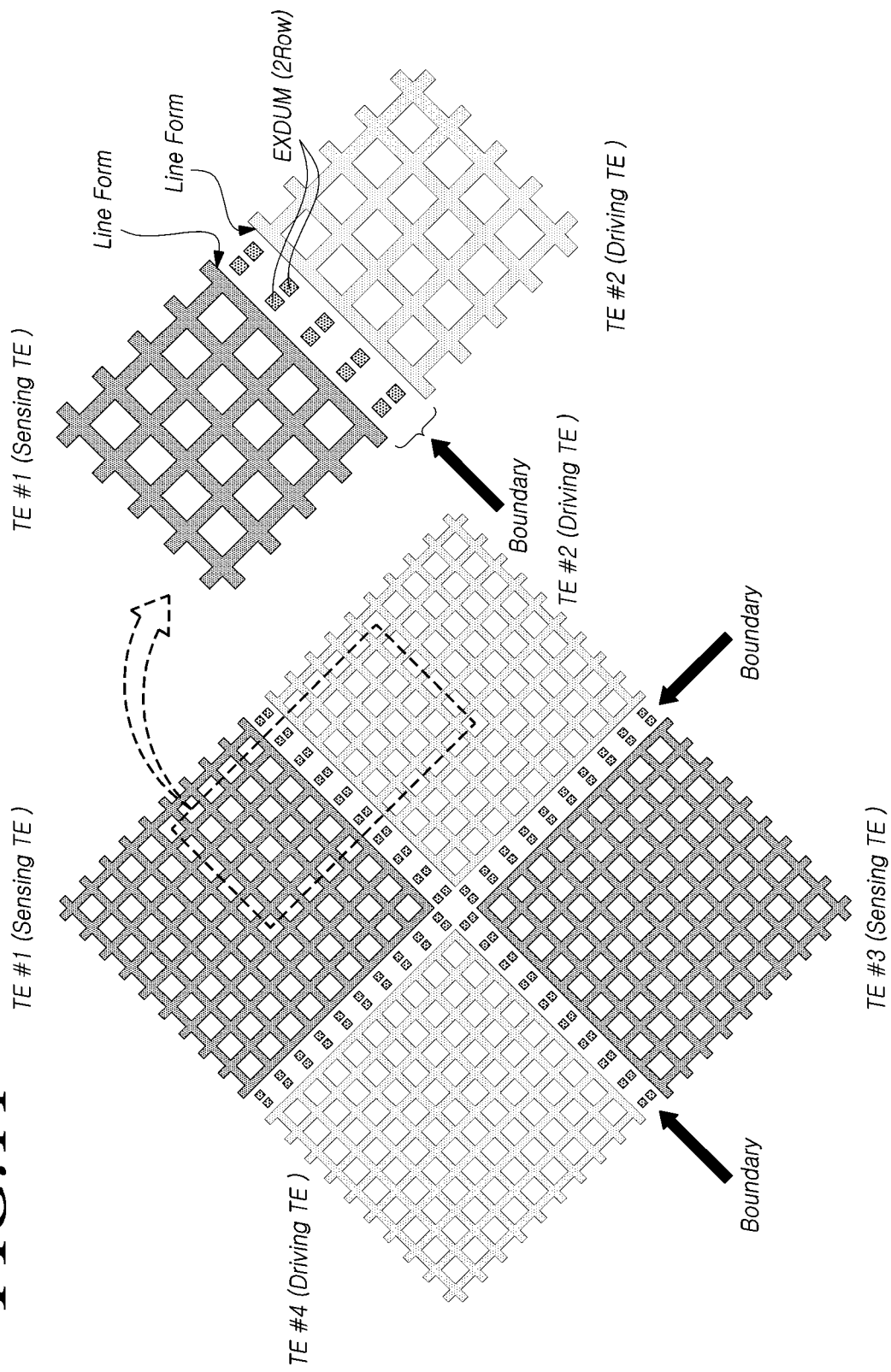
Figure 12:
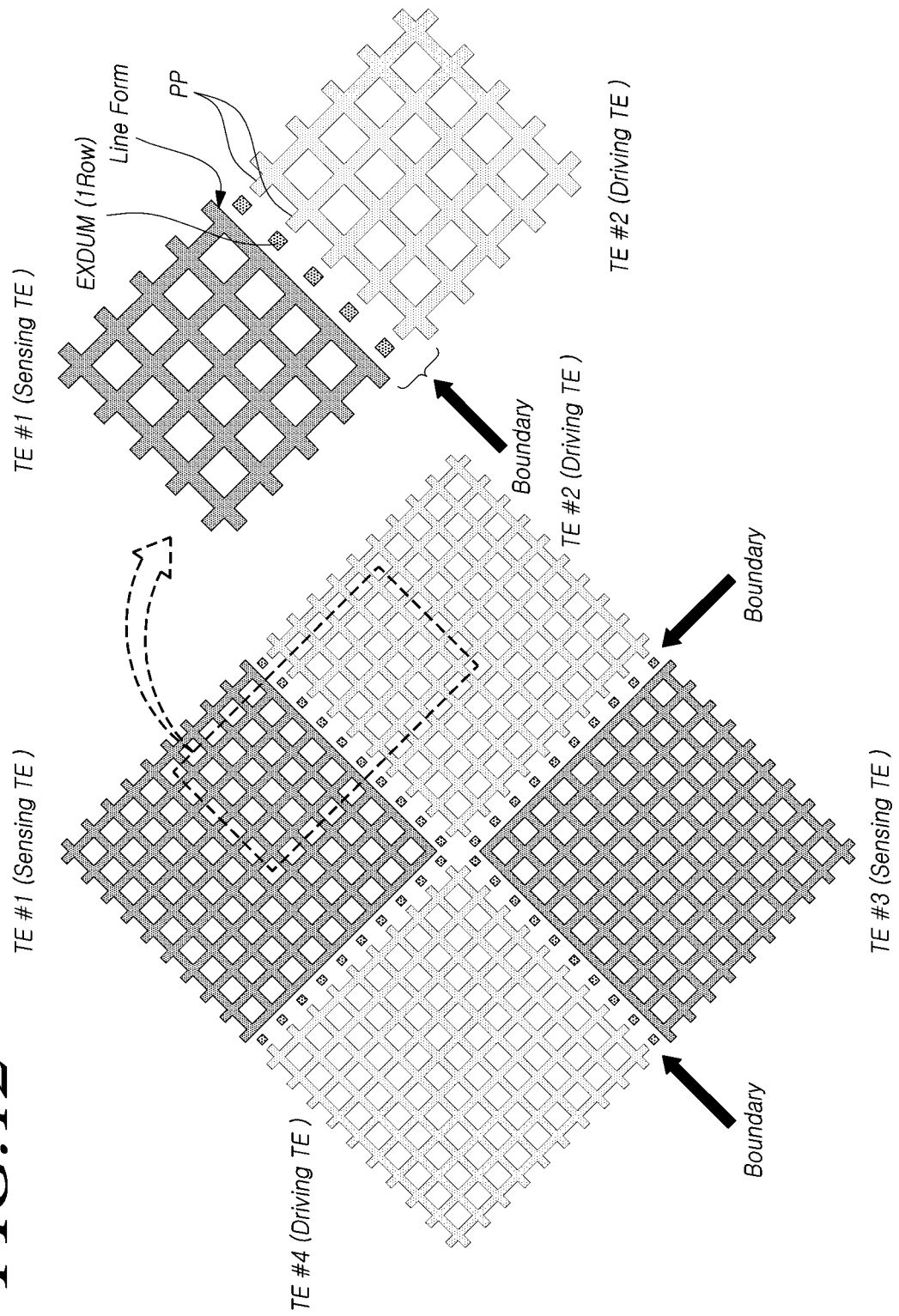

FIGS. 10 to 12 are example diagrams each illustrating a short-circuit prevention structure of adjacent touch electrodes disposed on a touch panel TSP in the touch display device according to embodiments of the present disclosure.

Referring to FIGS. 10 to 12, among the plurality of touch electrodes, a first touch electrode TE #1 corresponding to a sensing touch electrode and a second touch electrode TE #2 corresponding to a driving touch electrode are disposed adjacent to each other and are electrically separated from each other.

In addition, in the boundary region between the first touch electrode TE #1 and the second touch electrode TE #2, at least one external dummy metal EXDUM (e.g., a dummy metal part or a piece of dummy metal) may be disposed which is spaced apart from both the first touch electrode TE #1 and the second touch electrode TE #2. For example, the piece of dummy metal can be referred to as "external" because it is outside of the touch electrode (e.g., in between electrodes and electrically isolated form the electrodes), even though the dummy metal pieces can be embedded within a layer or used inside an in-cell type of touchscreen according to embodiments.

Since the at least one external dummy metal EXDUM (e.g., small piece of metal) is disposed in the boundary region between the first touch electrode TE #1 and the second touch electrode TE #2, the first touch electrode TE #1 and the second touch electrode TE #2 can be electrically separated from each other without being short-circuited even if foreign matter or the like is generated in the boundary region between the first touch electrode TE #1 and the second touch electrode TE #2 due to a process failure. Accordingly, it is possible to manufacture a touch panel TSP capable of normal touch sensing in spite of a process failure of panel manufacturing. For example, the one or more pieces of dummy metal can increase the distance that separates adjacent electrodes while also smoothing out or hiding the visual transition between adjacent electrodes (e.g., the metal pieces can help visually soften or shade the boundary regions between electrodes).

Referring to FIGS. 10 to 12, when the electrode metal EM is patterned in a mesh type and the cutting process for separating the electrode metal EM for forming touch electrodes is performed, at least one external dummy metal EXDUM (e.g., a piece of dummy metal), which is spaced apart from both the first touch electrode TE #1 and the second touch electrode TE #2, can be formed in the boundary region between the first touch electrode TE #1 and the second touch electrode TE #2 through an additional cutting process in the touch electrode boundary region.

Accordingly, the at least external dummy metal EXDUM and the plurality of touch electrodes TE can be the same material (e.g., a mesh or net like metal layer can be cut like a pizza to define touch electrodes, similar to how pizza slices are cut). And the at least external dummy metal EXDUM and the plurality of touch electrodes TE can be located on the same layer.

According to the foregoing description, when forming the plurality of touch electrodes TE through the cutting process, one or more external dummy metal EXDUM can be easily formed, thus simplifying design, improving manufacturing and increasing yields.

Referring to FIG. 10, in the touch display device according to embodiments of the present disclosure, a plurality of external dummy metals EXDUM can be disposed in a row in the boundary region between two adjacent touch electrodes TE #1 and TE #2 disposed on a touch panel TSP.

As described above, since the plurality of external dummy metals EXDUM are arranged in a row in the boundary region between the first touch electrode TE #1 and the second touch electrode TE #2, it is possible to prevent the first touch electrode TE #1 and the second touch electrode TE #2 from being short-circuited by foreign matter or the like while keeping the distance between the first touch electrode TE #1 and the second touch electrode TE #2 short.

Referring to FIG. 10, in the touch display device according to the embodiments of the present disclosure, a plurality of external dummy metals EXDUM can be disposed in two or more rows in the boundary region between two adjacent touch electrodes TE #1 and TE #2 disposed on a touch panel TSP (e.g., by applying additional laser cuts).

As described above, since the plurality of external dummy metals EXDUM are arranged in a row in the boundary region between the first touch electrode TE #1 and the second touch electrode TE #2, it is possible to more effectively prevent the first touch electrode TE #1 and the second touch electrode TE #2 from being short-circuited by foreign matter or the like.

Referring to FIGS. 10 to 12, in the boundary region between the first touch electrode TE #1 and the second touch electrode TE #2, the outline of at least one of the first touch electrode TE #1 and the second touch electrode TE #2 can be in the form of a line (e.g., the mesh can be cut so that the electrodes have flat/straight edges).

For example, as illustrated in FIGS. 10 and 11, in the boundary region between the first touch electrode TE #1 and the second touch electrode TE #2, the outlines of both the first touch electrode TE #1 and the second touch electrode TE #2 can be in the form of a line.

In another example, as illustrated in FIG. 12, in the boundary region between the first touch electrode TE #1 and the second touch electrode TE #2, among the first touch electrode TE #1 and the second touch electrode TE #2, only the outline of the first touch electrode TE #1 may be in the form of a line (e.g., TE #2 can have perforated edge, while TE #1 can have a straight/flat edge).

As described above, in the boundary region between the first touch electrode TE #1 and the second touch electrode TE #2, at least one of the first touch electrode TE #1 and the second touch electrode TE #2 is formed, so that the distance between the first touch electrode TE #1 and the second touch electrode TE #2 can be reduced (e.g., the electrodes can be spaced very closely together). Accordingly, the ratio between the region where an electrode metal EM is present and the region where an electrode metal EM is not present can be reduced, and thus the difference in metal reflectance of the internal light and external light is reduced, so that a phenomenon, which causes the touch electrodes TE to be visible, can be prevented and thus image quality can be improved.

In addition, in the boundary region between the first touch electrode TE #1 and the second touch electrode TE #2, a plurality of protrusions PP may exist on the outline of the electrode metal EM corresponding to at least one of the first touch electrode TE #1 and the second touch electrode TE #2 (e.g., the electrode can have a perforated edge, or edges with bumps that stick out).

For example, as illustrated in FIG. 12, in the boundary region between the first touch electrode TE #1 and the second touch electrode TE #2, a plurality of protrusions PP can exist on the outline of the electrode metal EM corresponding to the second touch electrode TE #2 among the first touch electrode TE #1 and the second touch electrode TE #2.

As described above, when the electrode metal cutting is performed such that a plurality of protrusions PP is formed on the outline of the electrode metal EM corresponding to at least one of the first touch electrode TE #1 and the second touch electrode TE #2, the process can be made easier in comparison of the situation where the electrode metal cutting process is performed in the form of a line in which the plurality of projections PP are not present.

In addition, at least one of the first touch electrode TE #1 and the second touch electrode TE #2 illustrated in FIGS. 8 to 12 is a driving touch electrode (Driving TE) and the other is a sensing touch electrode (Sensing TE).

Therefore, the touch sensing circuit TSC can apply a driving signal to one of the first touch electrode TE #1 and the second touch electrode TE #2 and can receive a sensing signal from a remaining one.

In this instance, the touch display device according to the embodiments of the present disclosure can sense a touch by a mutual-capacitance-based touch sensing scheme.

In addition, the touch sensing circuit TSC may apply a driving signal to each of the first touch electrode TE #1 and the second touch electrode TE #2, and may receive a sensing signal from each of the first touch electrode TE #1 and the second electrode TE #2.

In this instance, the touch display device according to the embodiments of the present disclosure can sense a touch by a self-capacitance-based touch sensing scheme.

Figure 13:
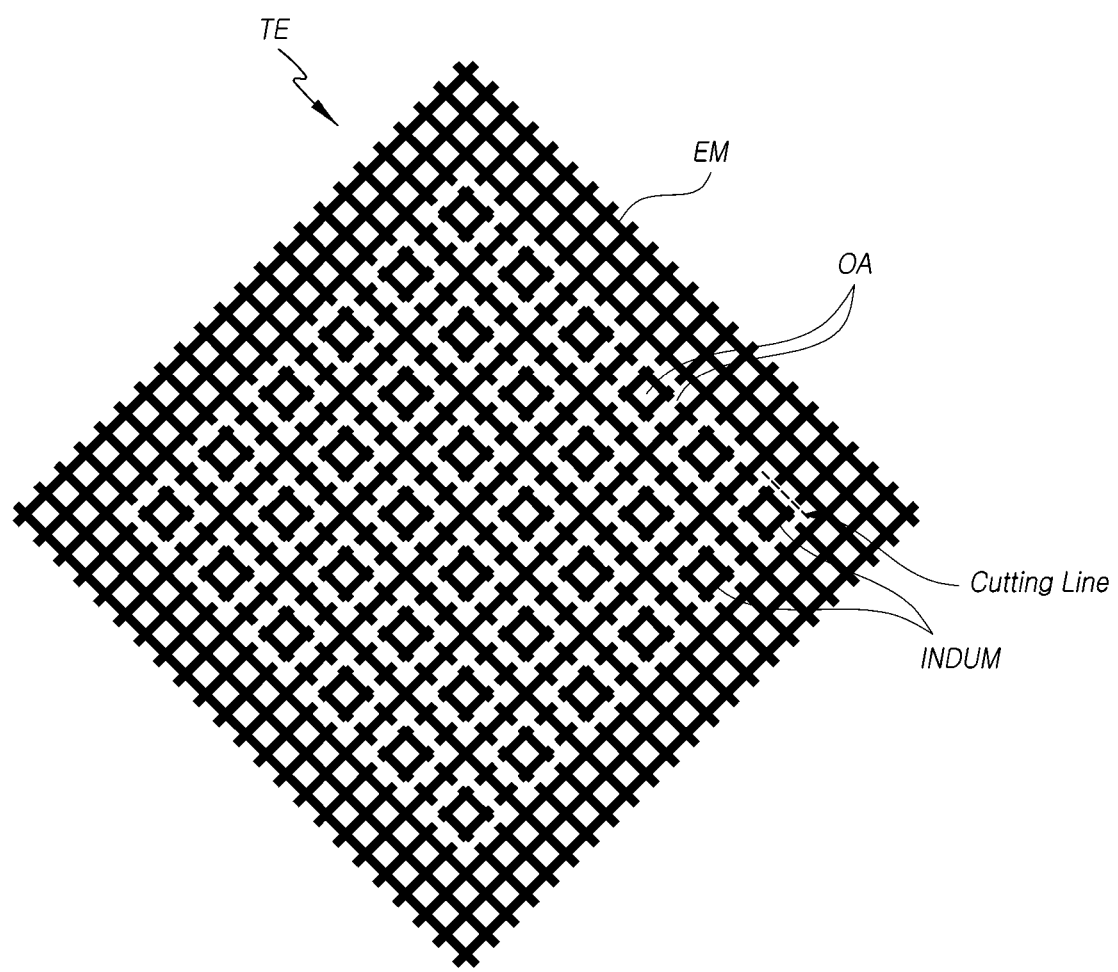
FIGS. 13 to 15 are views each illustrating the situation where an internal dummy metal is present in a mesh-type touch electrode region disposed on a touch panel in the touch display device according to embodiments of the present disclosure.
Figure 14:
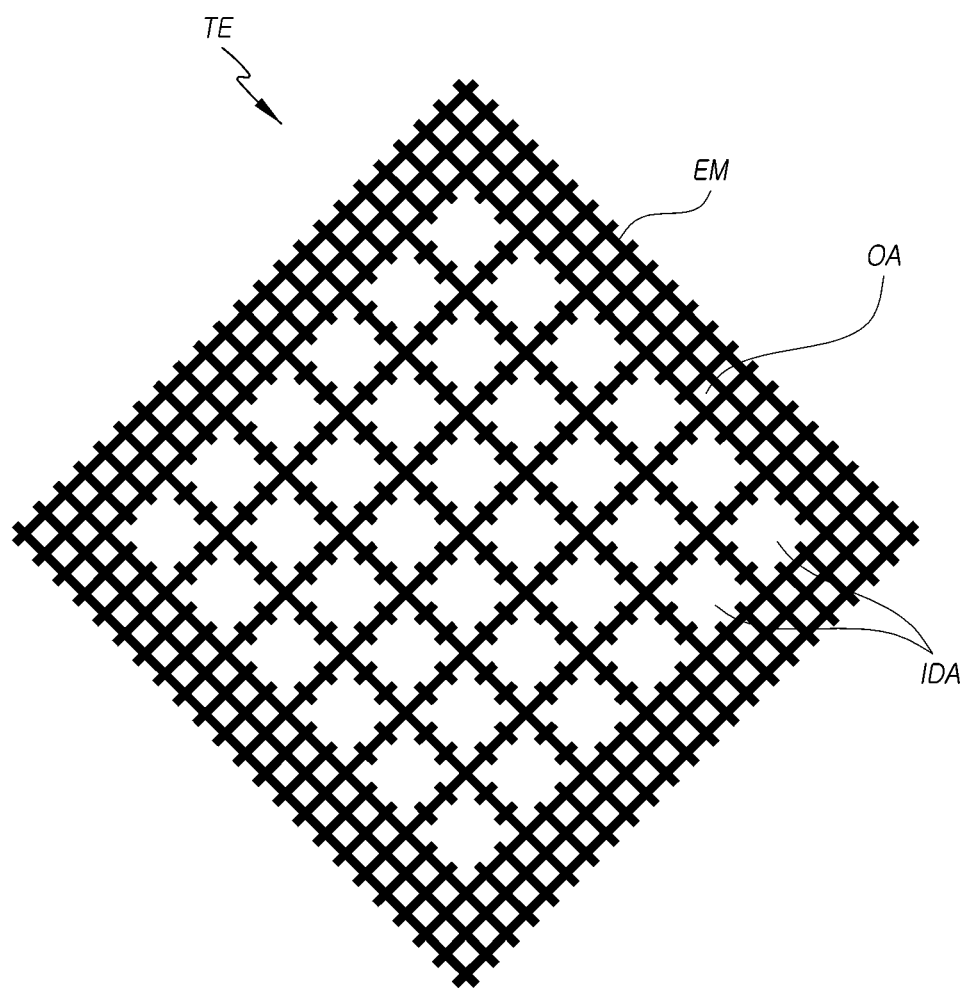
Figure 15:
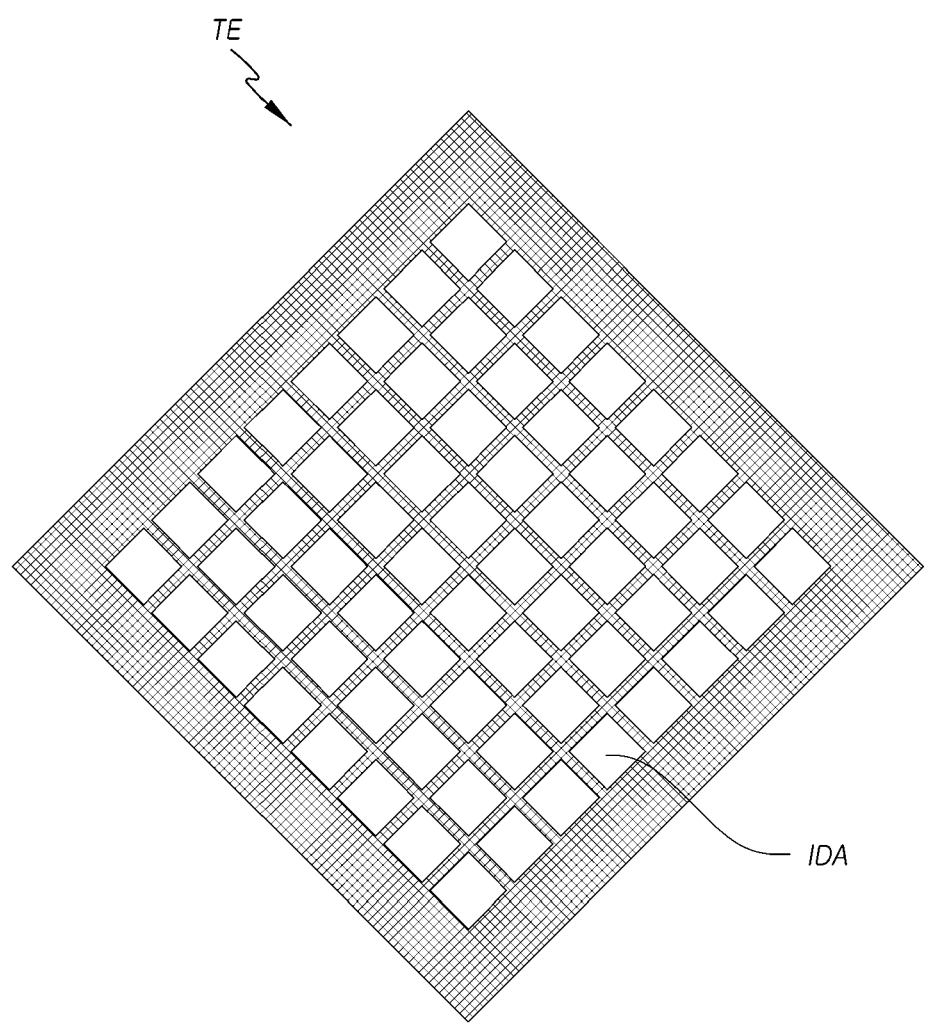

FIGS. 13 to 15 are views each illustrating the situation where an internal dummy metal INDUM is present in a mesh-type touch electrode TE region disposed on a touch panel TSP in the touch display device according to the embodiments of the present disclosure. For example, the piece of dummy metal can be referred to as "internal" because it is inside of the touch electrode but electrically isolated from the electrode (e.g., within the outer perimeter of the electrode), even though the dummy metal pieces can be on top of a layer or embedded within a layer, or used inside an in-cell or on-cell type of touchscreen or touch panel according to embodiments.

Referring to FIGS. 13 to 15, in the region of all or some of the plurality of touch electrodes TE disposed on the touch panel TSP, an electrode metal EM patterned in a mesh type and at least one internal dummy metal INDUM can be disposed.

In addition, when the at least one internal dummy metal INDUM does not exist in the region of one touch electrode TE and only the electrode metal EM exists in the mesh type, a visibility problem may arise which causes the outline of the electrode metal EM to be visible on a screen (e.g., the touch electrode may block too much light). However, by forming the internal dummy metal INDUM in the touch electrode region, it is possible to prevent the visibility problem that may arise when one touch electrode TE is patterned in the form of a mesh (e.g., cuts can be performed inside a touch electrode to allow more light to pass through it, thus improving image quality).

The electrode metal EM is patterned in the form of a mesh, and then the electrode metal EM patterned in the form of a mesh is cut in order to form a touch electrode (a cutting process for touch electrode formation).

Thereafter, the electrode metal EM patterned in the form of a mesh in one touch electrode region is cut into a predetermined pattern (a cutting process for internal dummy metal formation) to form an internal dummy metal INDUM which is broken with the electrode metal EM (e.g., the internal dummy metal INDUM is electrically isolated form the electrode metal EM).

When the internal dummy metal INDUM is formed as described above, the internal dummy metal INDUM is a portion that broken away from the electrode metal EM by the cutting process.

Accordingly, at least one internal dummy metal INDUM in the touch electrode region can be disposed in the same layer as the electrode metal EM corresponding to each of the plurality of touch electrodes TE and can be made of the same material as the electrode metal EM.

According to the method of forming the internal dummy metal INDUM described above, there is an advantage in that the internal dummy metal INDUM can be formed more easily and the electrode metal EM and the dummy metal DM can be formed in a single layer.

FIG. 14 is a diagram illustrating an electrode metal EM corresponding to a touch electrode TE in which the internal dummy metal INDUM is omitted in FIG. 13, and FIG. 15 is a diagram illustrating FIG. 14 in a simplified form.

Referring to FIGS. 14 and 15, it can be seen that the size or the surface area of the electrode metal to which a driving signal is applied or from which a sensing signal is received at one touch electrode TE is reduced by the open space IDA or the open space around the internal dummy metal INDUM.

Figure 16:
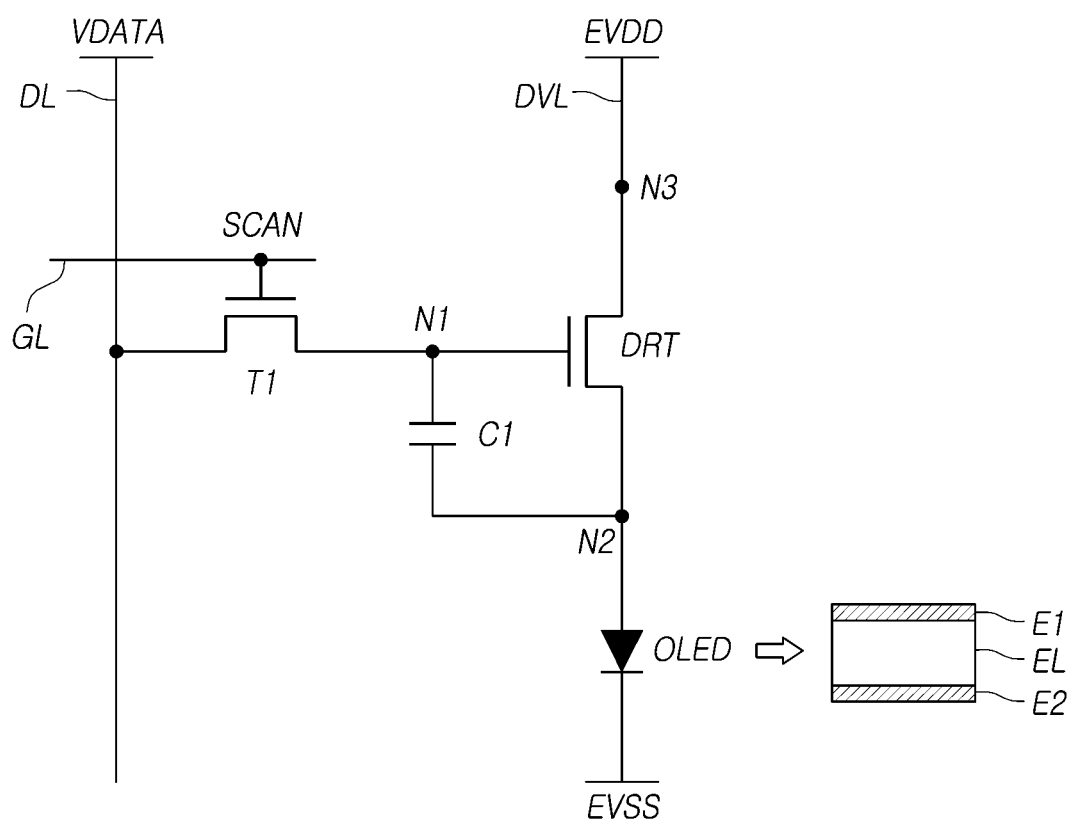
FIG. 16 is an example view of the structure of a sub-pixel in the touch display device according to embodiments of the present disclosure.
Figure 17:
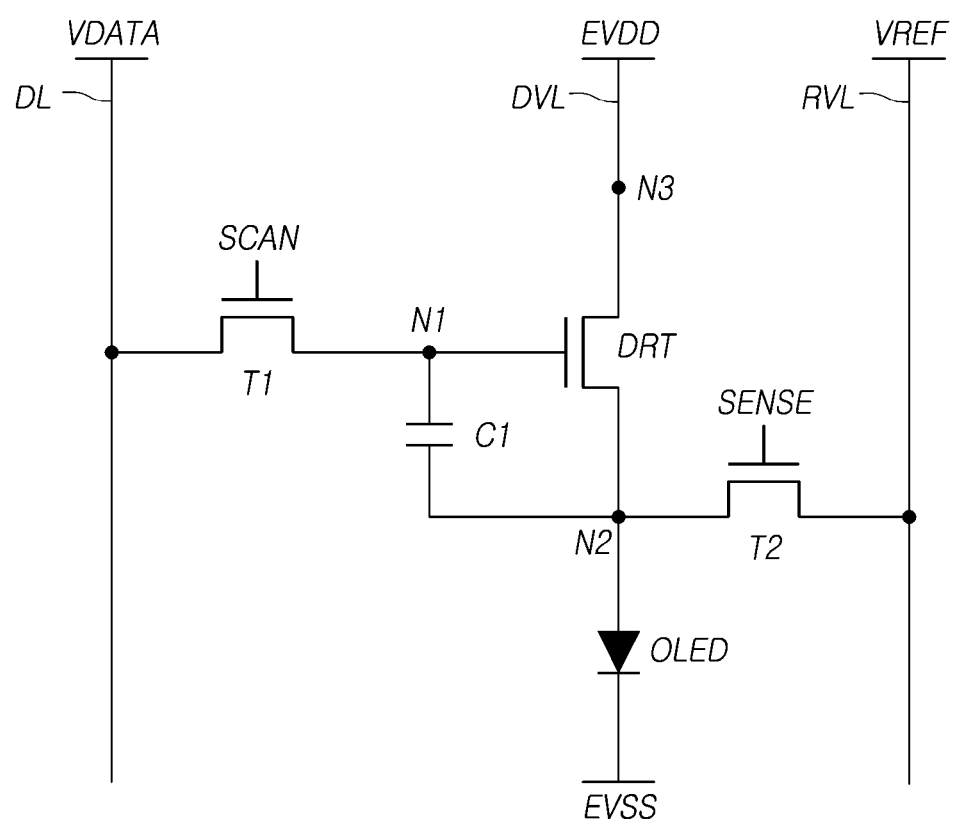
FIG. 17 is another example view of the structure of a sub-pixel in the touch display device according to embodiments of the present disclosure.

FIG. 16 is an example view of the structure of a sub-pixel in the touch display device according to embodiments of the present disclosure, and FIG. 17 is another example view of the structure of a sub-pixel in the touch display device according to embodiments of the present disclosure.

Referring to FIG. 16, when the touch display device 100 according to embodiments is an OLED display device, each sub-pixel can include an OLED, a driving transistor DRT configured to drive the OLED, a first transistor T1 configured to transmit a data voltage to a first node N1 corresponding to a gate node of the driving transistor DRT, and a storage capacitor Cst configured to maintain a data voltage corresponding to an image signal voltage or a voltage corresponding thereto for one frame period.

The OLED can include a first electrode E1 (e.g., an anode electrode or a cathode electrode), an organic light-emitting layer EL, a second electrode E2 (e.g., a cathode electrode or an anode electrode), and the like.

A ground voltage EVSS can be applied to the second electrode E2 of the OLED.

The driving transistor DRT drives the OLED by supplying a driving current to the OLED.

The driving transistor DRT has a first node N1, a second node N2, and a third node N3.

The first node N1 of the driving transistor DRT is a node corresponding to a gate node, and may be electrically connected to a source node or a drain node of the first transistor T1.

The second node N2 of the driving transistor DRT may be electrically connected to the first electrode E1 of the OLED, and may be a source node or a drain node.

The third node N3 of the driving transistor DRT can be a node to which a driving voltage EVDD is applied, and may be electrically connected to a driving voltage line DVL that supplies the driving voltage EVDD. The third node N3 can be a drain node or a source node.

The first transistor T1 is electrically connected between the data line DL and the first node N1 of the driving transistor DRT, and may be controlled by receiving a scan signal SCAN applied to the gate node thereof through the gate line.

The first transistor T1 can be turned on by the scan signal SCAN to transmit the data voltage Vdata supplied from the data line DL to the first node N1 of the driving transistor DRT.

The storage capacitor Cst can be electrically connected between the first node N1 and the second node N2 of the driving transistor DRT.

The storage capacitor Cst is not a parasitic capacitor (e.g., Cgs or Cgd) which is an internal capacitor existing between the first node N1 and the second node N2 of the driving transistor DRT, but an external capacitor intentionally designed outside the driving transistor DRT.

In addition, as illustrated in FIG. 17, each sub-pixel can further include a second transistor T2 in order to control the voltage of the second node N2 of the driving transistor DRT or to sense the characteristic value of the sub-pixel (e.g., the threshold voltage or mobility of the driving transistor DRT or the threshold voltage of the OLED.

The second transistor T2 may be electrically connected between the second node N2 of the driving transistor DRT and the reference voltage line RVL that supplies a reference voltage Vref, and can be controlled by receiving a sensing signal SENSE, which is a kind of scan signal, by the gate node.

The second transistor T2 is turned on by the sensing signal SENSE to apply the reference voltage Vref supplied via the reference voltage line RVL to the second node N2 of the driving transistor DRT.

The second transistor T2 can be utilized as one of voltage sensing paths for the second node N2 of the driving transistor DRT.

In addition, the scan signal SCAN and the sense signal SENSE may be separate gate signals. In this instance, the scan signal SCAN and the sensing signal SENSE may be respectively applied to the gate node of the first transistor T1 and the gate node of the second transistor T2 via different gate lines.

In some situations, the scan signal SCAN and the sensing signal SENSE may be the same gate signal. In this instance, the scan signal SCAN and the sensing signal SENSE may be commonly applied to the gate node of the first transistor T1 and the gate node of the second transistor T2 via the same gate line.

Each of the driving transistor DRT, the first transistor T1, and the second transistor T2 may be an n-type transistor or a p-type transistor.

Each sub-pixel structure can be modified in various ways in addition to those illustrated in FIGS. 16 and 17.

Figure 18:
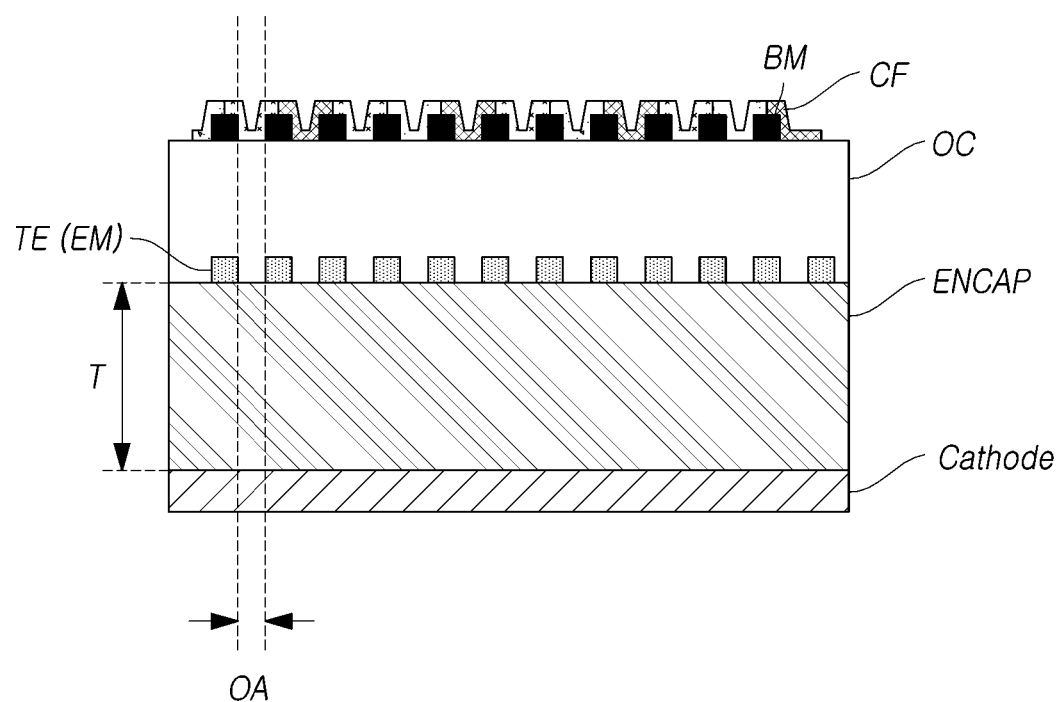
FIGS. 18 to 20 are cross-sectional diagrams each illustrating a touch display device according to embodiments of the present disclosure.
Figure 19:
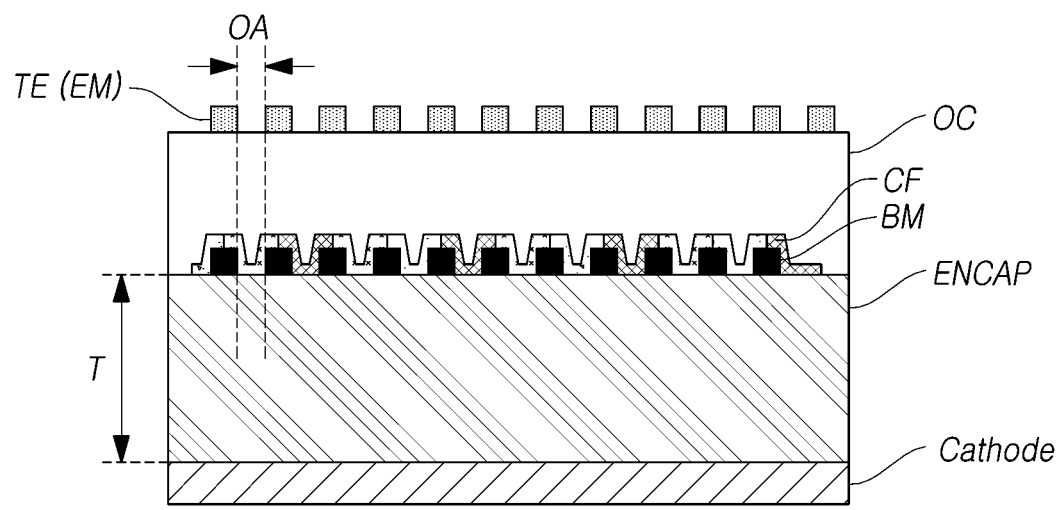
Figure 20:
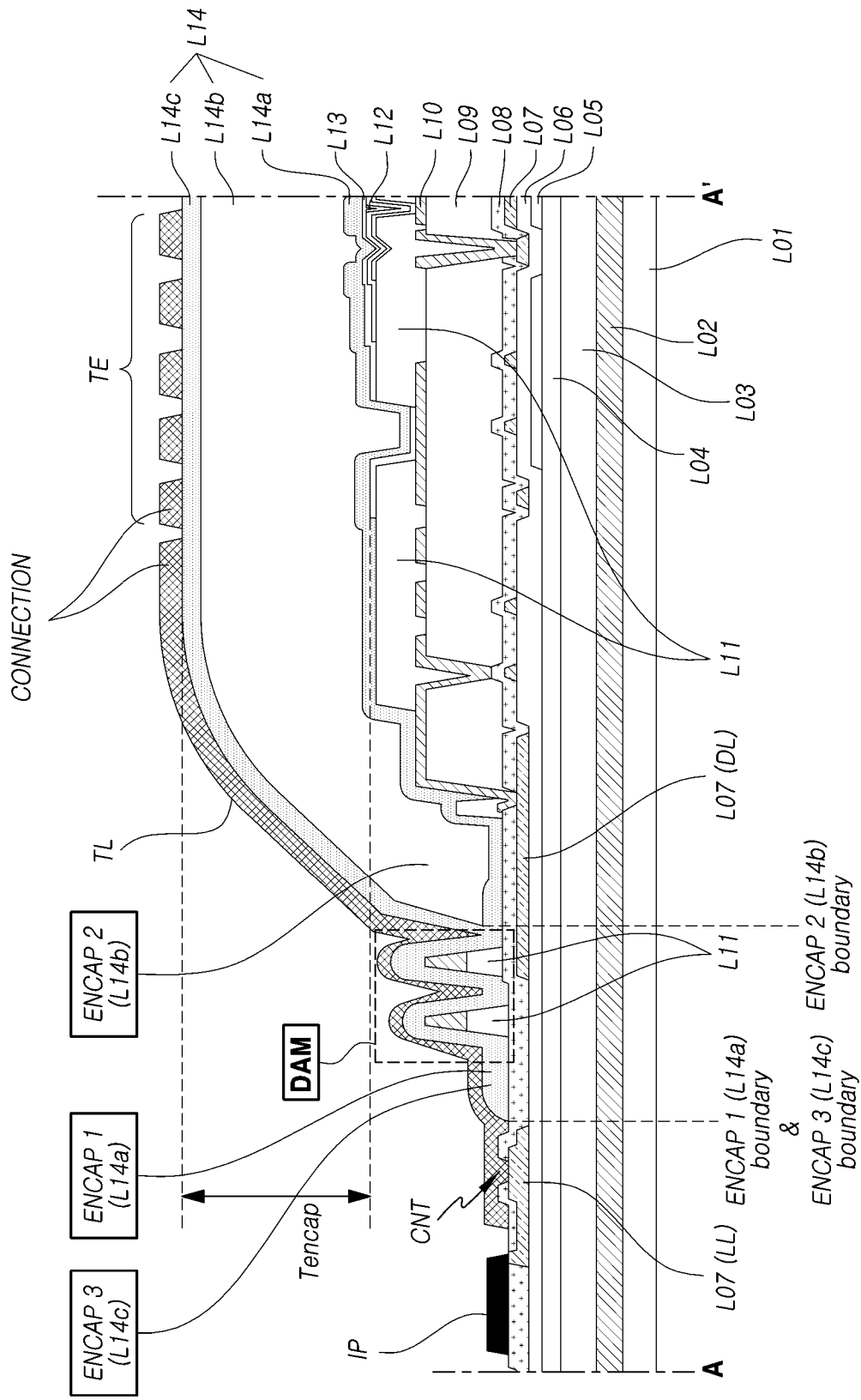

FIGS. 18 to 20 are cross-sectional diagrams each illustrating a display device according to embodiments of the present disclosure.

Referring to FIGS. 18 and 20, when a touch panel TSP is built in a display panel DISP and the display panel DISP is implemented as an OLED display panel, the touch panel TSP can be placed on an encapsulation layer ENCAP in the display panel DISP. In other words, touch sensor metal such as a plurality of touch electrodes TE and a plurality of touch lines TL can be placed on the encapsulation layer ENCAP in the display panel DISP.

As described above, by forming the touch electrodes TE on the encapsulation layer ENCAP, the touch electrodes TE can be formed without greatly affecting the display performance and the formation of a layer for the display.

In addition, referring to FIGS. 18 and 20, a cathode (Cathode), which can be the second electrode E2 of the OLED, can be present below the encapsulation layer ENCAP.

The thickness T of the encapsulation layer ENCAP can be, for example, approximately 5 micrometers or more.

As described above, parasitic capacitance formed between the cathode (Cathode) of the OLED and the touch electrodes TE can be reduced by designing the thickness of the second substrate ENCAP to be approximately 5 micrometers or more. Thus, it is possible to prevent a deterioration in touch sensitivity due to parasitic capacitance.

As described above, each of the plurality of touch electrodes TE is patterned in the form of a mesh in which the electrode metal EM has a plurality of open areas OA. In the plurality of open areas OA, one or more sub-pixels or light-emitting regions thereof can exist when viewed in a vertical direction.

As described above, the electrode metals EM of the touch electrodes TE are patterned such that, when viewed in a plan view, the light-emitting region of at least one sub-pixel exists to correspond to the position of each of the open areas OA existing in the region of the touch electrodes TE, it is possible to enhance the light emission efficiency of the display panel DISP.

Accordingly, as illustrated in FIGS. 18 and 19, the position of a black matrix BM can correspond to the position of the electrode metals EM of the touch electrodes TE.

In addition, the positions of a plurality of color filters CF correspond to the positions of the plurality of touch electrodes TE.

As described above, since the plurality of color filters CF are located at positions corresponding to the positions of the plurality of open areas OA, it is possible to provide an OLED display panel (in particular, when a white OLED is used) and a touch display device having an excellent light emission performance.

The vertical positional relationship between the plurality of color filters CF and the plurality of touch electrodes TE will now be described.

As illustrated in FIG. 18, the plurality of color filters CF and the black matrix BM may be placed on the plurality of touch electrodes TE.

The plurality of color filters CF and the black matrix BM may be placed on an overcoat layer OC on the plurality of touch electrodes TE.

As illustrated in FIG. 19, the plurality of color filters CF (e.g., RGB, or RGBW) and the black matrix BM can be placed under the plurality of touch electrodes TE.

The plurality of touch electrodes TE can be placed on the overcoat layer OC on the plurality of color filters CF and the black matrix BM.

As described above, it is possible to provide a touch display device having an optimal positional relationship between the color filters CF and the touch electrodes TE in consideration of display performance such as light-emitting performance and touch performance.

In addition, attempts to incorporate a touch panel TSP including touch electrodes TE in a display panel DISP have been made in order to improve manufacturing convenience of the touch display device and to reduce the size of the touch display device.

However, in order to incorporate the touch panel TSP in the display panel DISP, which is an OLED display panel, considerable difficulties and many limitations exist.

For example, during the manufacturing process of a display device DISP, which is an OLED display panel, there is a limit in that a high-temperature process for forming touch electrodes TE, which are generally made of a metallic material, inside the panel cannot be freely performed due to an organic material.

It is difficult to arrange the touch electrodes TE serving as touch sensors inside the display panel DISP, which is an OLED display panel, due to constraints such as a structural characteristic and a process of the OLED display panel. Therefore, in the related art, a touch structure has been implemented by attaching a touch panel TSP onto a display panel DISP, which is an OLED display panel, rather than incorporating the touch panel TSP in a display panel DISP, which is an OLED display panel.

However, as illustrated in FIGS. 18 and 19, it is possible to provide a display panel DISP, which is an OLED display panel, in which a touch panel TSP having excellent display performance and touch performance is incorporated through a structure of forming the touch electrodes TE on the encapsulation layer ENCAP, for example.

Referring to FIG. 20, a polyimide layer L02 is disposed on a substrate or a back plate L01.

A buffer layer L03 can be placed on the polyimide layer L02, and an interlayer insulating film L04 can be placed on the buffer layer L03.

A gate layer L05 can be present on the interlayer insulating film L04, and gate electrodes or the like can be formed on the gate layer L05 at necessary positions.

A gate insulating film L06 can be present on the gate layer L05.

A source/drain layer L07 can be present on the gate insulating film L06.

In the source/drain layer L07, signal lines such as data lines DL and a link line LL for metal connection, source/drain electrodes of various transistors, etc. can be formed.

A protective layer L08 can be present on the source/drain layer L07.

A planarization layer L09 can be placed on the protective layer L08, and a first electrode layer L10 in which a first electrode E1 is formed at the light emission position of each sub-pixel SP, can be present on the planarization layer L09.

A bank L11 is placed on the first electrode layer L10, and an organic light-emitting layer L12 is placed on the bank L11.

A second electrode layer L13, which is formed in common to all the sub-pixel regions, can be present on the organic light-emitting layer L12.

On the second electrode layer L13, an encapsulation layer L14 can be present to prevent penetration of moisture, air, or the like.

In addition, a dam (DAM) can exist in a panel edge.

The encapsulation layer L14 can be a single layer, or can be formed by laminating two or more layers. Further, the encapsulation layer L14 can be formed of a metallic layer, or can be formed by laminating two or more organic layers and inorganic layers.

FIG. 20 illustrates a situation in which the encapsulation layer L14 is formed by laminating a first encapsulation layer L14*a*, a second encapsulation layer L14*b*, and a third encapsulation layer L14*c*.

Each of the first encapsulation layer ENCAP 1 (L14*a*), the second encapsulation layer ENCAP 2 (L14*b*), and the third encapsulation layer ENCAP 3 (L14*c*) may be constituted with an organic layer and an inorganic layer.

The touch electrodes TE are formed on the encapsulation layer L14 described above.

The touch electrodes TE are an example of a mesh type having open areas OA. In this instance, the touch electrodes TE can be transparent electrodes.

A touch line TL can also be formed on the encapsulation layer L14.

The touch line TL and the touch electrodes TE can be formed on different layers or on the same layer.

The touch line TL connected to the touch electrodes TE extend through a region where the dam (DAM) is located and extends to the region outside the dam, that is, the region adjacent to a pad IP.

The touch line TL can be connected to the link line LL formed in the source/drain layer L07 through a contact hole CNT in the region outside the dam.

The link line LL can be electrically connected to the pad IP existing in the region outside the dam for connection with the touch driving circuit TDC.

The encapsulation layer L14 can be formed to have a predetermined thickness (Tencap). Here, the thickness (Tencap) of the encapsulation layer L14 may be designed in consideration of an RC delay and influence on touch performance (touch sensitivity) during touch driving and touch sensing.

In addition, the dam (DAM) can be formed at or near one or more boundary points of the first, second, and third encapsulation layers L14*a*, L14*b*, and L14*c*.

This dam (DAM) can be formed high by stacking the bank L11 and the encapsulation layer L14.

This dam (DAM) is capable of preventing the encapsulation layers L14*a*, L14*b*, and L14*c* from collapsing to the outline of the panel.

In addition, since the encapsulation layers L14*a*, L14*b*, and L14*c* partially extend in the dam (DAM), the dam (DAM) is capable of performing a sealing function, thereby protecting the pixels and the like from moisture and the like flowing into the inside of the panel from the side.

Referring to FIG. 20, a plurality of touch lines TL electrically connected to a plurality of touch electrodes TE is disposed on a display panel DISP. In the outline region (the region outside the dam) of the display panel DISP, the encapsulation layer L14 may not be disposed under the plurality of touch lines TL.

Meanwhile, an electrode metal EM corresponding to each of the plurality of touch electrodes TE may overlap a plurality of banks L11 defining a sub-pixel region.

According to the embodiments of the present disclosure described above, it is possible to provide a touch display device and a panel having a structure capable of preventing a short circuit between touch electrodes.

According to the embodiments of the present disclosure, it is possible to provide a touch display device and a panel having a structure capable of improving touch sensitivity.

According to the embodiments of the present disclosure, it is possible to provide a touch display device and a panel having a structure capable of improving image quality while improving touch sensitivity.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment. The scope of the present disclosure shall be construed based on the accompanying claims so all of the technical ideas included within the scope equivalent to the claims belong to the present disclosure.

What is claimed is:

1. A touch display device comprising:
   a plurality of data lines disposed over a substrate;
   a protective layer disposed over the plurality of data lines;
   an encapsulation layer disposed over plurality of data lines;
   a plurality of touch electrodes disposed over the encapsulation layer, and including a first touch electrode, a second touch electrode, and a third touch electrode, the first touch electrode being adjacent to and electrically isolated from the second and third touch electrodes;
   a touch line electrically connected to at least one of the plurality of touch electrodes;
   a pad disposed outside of, and spaced apart from, the encapsulation layer;
   a link line disposed in a same layer as at least one of the plurality of data lines, connected to the touch line through a contact hole of the protective layer, and electrically connected to the pad;
   a touch sensing circuit configured to drive the panel to sense a touch or a touch position; and
   at least two external dummy metals disposed along a first boundary region between a first side of the first touch electrode and the second touch electrode and a second boundary region between a second side of the first touch electrode and the third touch electrode, respectively, the first boundary region and the second boundary region intersecting each other at one corner of the first touch electrode,
   wherein the at least two external dummy metals are spaced apart from and electrically, isolated from the first, second and third touch electrodes,
   wherein each of the plurality of touch electrodes includes an electrode metal patterned in a mesh type, a plurality of open areas are formed in each of the plurality of touch electrodes,
   wherein a row of rectangular shaped external dummy metals is disposed between the first touch electrode and the second touch electrode, and one side of the row of rectangular shaped external dummy metals is directly adjacent to a continuous flat edge of the first touch electrode and another side of the row of rectangular shaped external dummy metals is directly adjacent to a perforated edge of the second touch electrode, and
   wherein the perforated edge of the second touch electrode includes a plurality of rectangular shaped protrusions extending toward the row of rectangular shaped external dummy metals, and each of the rectangular shaped external dummy metals in the row of rectangular shaped external dummy metals is aligned with and has a same width as a corresponding one of the plurality of rectangular shaped protrusions.

2. The touch display device of claim 1, wherein the at least two external dummy metals are disposed over a same layer as the plurality of touch electrodes and is made of a same material as the plurality of touch electrodes.

3. The touch display device of claim 1, wherein the first boundary region includes a plurality of external dummy metals arranged in a row between the first touch electrode and the second touch electrode, and the plurality of external dummy metals are electrically isolated from the first and second touch electrodes.

4. The touch display device of claim 1, wherein the first boundary region includes a plurality of external dummy metals arranged in two or more rows between the first touch electrode and the second touch electrode, and the plurality of external dummy metals are electrically isolated form the first and second touch electrodes.

5. The touch display device of claim 1, wherein at least one outline of the first touch electrode and the second touch electrode is in a form of a straight line in the first boundary region between the first side of the first touch electrode and the second touch electrode.

6. The touch display device of claim 1, wherein an outline of an electrode metal corresponding to at least one of the first touch electrode and the second touch electrode includes a plurality of protrusions in the first boundary region between the first side of the first touch electrode and the second touch electrode.

7. The touch display device of claim 1, wherein one or more internal dummy metals is disposed within an outer boundary of at least one of the plurality of touch electrodes, and
   wherein the one or more internal dummy metals are electrically isolated from the at least one of the plurality of touch electrodes.

8. The touch display device of claim 7, wherein the one or more internal dummy metals are disposed over a same layer as the electrode metal corresponding to each of the plurality of touch electrodes, and the one or more internal dummy metals are made of a same material as the electrode metal corresponding to each of the plurality of touch electrodes.

9. The touch display device of claim 1, wherein the touch sensing circuit applies a driving signal to one of the first touch electrode and the second touch electrode, and the touch sensing circuit receives a sensing signal from a remaining one of the first touch electrode and the second touch electrode.

10. The touch display device of claim 1, wherein the touch sensing circuit applies a driving signal to each of the first touch electrode and the second touch electrode, and the touch sensing circuit receives a sensing signal from each of the first touch electrode and the second touch electrode.

11. The touch display device of claim 1, further comprising:
    a plurality of gate lines, and a plurality of sub-pixels disposed over the substrate,
    wherein each of the plurality of open areas corresponds to a light-emitting region of at least one sub-pixel among the plurality of sub-pixels.

12. The touch display device of claim 1, wherein the at least two external dummy metals are resulted from cutting both the electrode metal corresponding to the first touch electrode and the electrode metal corresponding to the second electrode and cutting both the electrode metal corresponding to the first touch electrode and the electrode metal corresponding to the third electrode so that the at least two external dummy metals have a direct line shape.

13. The touch display device of claim 12, wherein the at least two external dummy metals are disposed in one row in each of the first and second boundary regions.

14. The touch display device of claim 1, wherein the encapsulation layer includes a first encapsulation layer, a third encapsulation layer and a second encapsulation layer disposed between the first and third encapsulation layers and being thicker than the first and third encapsulation layers,
   wherein the touch display device further comprises a dam disposed adjacent to an edge of the second encapsulation layer in a region between the pad and the plurality of touch electrodes, the dam including two protruding ridge portions,
   wherein the touch line is disposed over the dam, and the contact ole of the protective layer is between the pad and the dam adjacent to the pad, and
   wherein the touch line connects to the at least one of the plurality of touch electrodes and extends through a region where the dam is located and the touch line extends to a region outside of the dam that is adjacent to the pad for connecting with the link line.

15. A panel comprising:
   a plurality of data lines disposed over a substrate;
   a protective layer disposed over the plurality of data lines;
   an encapsulation layer disposed over the plurality of data lines;
   a plurality of touch electrodes disposed over the encapsulation layer, and including a first touch electrode, a second touch electrode, and a third touch electrode, the first touch electrode being adjacent to and electrically isolated from the second and third touch electrodes;
   a plurality of touch lines electrically connected to the plurality of touch electrodes;
   a pad disposed outside of, and spaced apart from, the encapsulation layer;
   a link line disposed in a same layer as at least one of the plurality of data lines, connected to at least one of the plurality of touch lines through a contact hole of the protective layer, and electrically connected to the pad; and
   at least two external dummy metals disposed along a first boundary region between a first side of the first touch electrode and the second touch electrode and a second boundary region between a second side of the first touch electrode and the third touch electrode, respectively, the first boundary region and the second boundary region intersecting each other at one corner of the first touch electrode,
   wherein the at least two external dummy metals are spaced apart from and electrically isolated from the first, second and third touch electrodes,
   wherein each of the plurality of touch electrodes includes an electrode metal patterned in a mesh type, a plurality of open areas are formed in each of the plurality of touch electrodes,
   wherein a row of rectangular shaped external dummy metals is disposed between the first touch electrode and the second touch electrode, and one side of the row of rectangular shaped external dummy metals is directly adjacent to a continuous flat edge of the first touch electrode and another side of the row of rectangular shaped external dummy metals is directly adjacent to a perforated edge of the second touch electrode, and
   wherein the perforated edge of the second touch electrode includes a plurality of rectangular shaped protrusions extending toward the row of rectangular shaped external dummy metals, and each of the rectangular shaped external dummy metals in the row of rectangular external dummy metals is aligned with and has a same width as a corresponding one of the plurality of rectangular shaped protrusions.

16. The panel of claim 15, wherein the at least two external dummy metals are disposed over a same layer as the plurality of touch electrodes.

17. The panel of claim 15, wherein at least one outline of the first touch electrode and the second touch electrode is in a form of a straight line in the first boundary region between the first side of the first touch electrode and the second touch electrode.

18. The panel of claim 15, wherein at least one of the first touch electrode and the second touch electrode includes a plurality of protrusions in the first boundary region between the first side of the first touch electrode and the second touch electrode.

19. The panel of claim 15, wherein one or more internal dummy metals are disposed within an outer boundary of at least one of the plurality of touch electrodes, and
   wherein the one or more internal dummy metals are electrically isolated from the at least one of the plurality of touch electrodes.

20. The panel of claim 19, wherein the one or more internal dummy metals are disposed over a same layer as the electrode metal corresponding to each of the plurality of touch electrodes, and the one or more internal dummy metals are made of a same material as the electrode metal corresponding to each of the plurality of touch electrodes.

* * * * *